US012655519B2

(12) United States Patent
Wijayawardhana et al.

(10) Patent No.: US 12,655,519 B2
(45) Date of Patent: Jun. 16, 2026

(54) REFRACTORY CARBIDE LAYER

(71) Applicant: SGL CARBON SE, Wiesbaden (DE)

(72) Inventors: Charles Wijayawardhana, Meitingen (DE); Christian Militzer, Meitingen (DE); Jing-Jia Huang, Meitingen (DE); Urban Forsberg, Sturefors (SE); Henrik Pedersen, Stigtomta (SE)

(73) Assignee: SGL CARBON SE, Wiesbaden (DE)

( * ) Notice: Subject to any disclaimer, the term of this patent is extended or adjusted under 35 U.S.C. 154(b) by 56 days.

(21) Appl. No.: 18/256,495

(22) PCT Filed: Dec. 9, 2021

(86) PCT No.: PCT/EP2021/084917
§ 371 (c)(1),
(2) Date: Jun. 8, 2023

(87) PCT Pub. No.: WO2022/122877
PCT Pub. Date: Jun. 16, 2022

(65) Prior Publication Data
US 2024/0026531 A1    Jan. 25, 2024

(30) Foreign Application Priority Data
Dec. 9, 2020    (DE) ..................... 10 2020 215 592.5

(51) Int. Cl.
*C23C 16/32* (2006.01)
*C23C 16/44* (2006.01)
*C30B 28/14* (2006.01)

(52) U.S. Cl.
CPC ........... *C23C 16/325* (2013.01); *C23C 16/44* (2013.01); *C30B 28/14* (2013.01)

(58) Field of Classification Search
CPC .................................................... C23C 16/325
USPC .......................................................... 428/698
See application file for complete search history.

(56) References Cited

U.S. PATENT DOCUMENTS 3,769,562 A    10/1973    Bean
9,194,042 B2    11/2015    Kamisuki et al.

FOREIGN PATENT DOCUMENTS

EP            3591101 A1    1/2020
WO    WO-2017070877 A1 *    5/2017    ........... C23C 16/325

OTHER PUBLICATIONS

International Search Report issued on Apr. 5, 2022, in corresponding International Patent Application No. PCT/EP2021/084917, 3 pages.
Office Action issued on Jul. 13, 2021, in corresponding German Application No. 10 2020 215 592.5, 15 pages.
Zhiying Hu et al: "Structural Controlling of Highly-Oriented Polycrystal 3C-SiC Bulks via Halide CVD", Materials 2019, 12 (3) 390, vol. 12, No. 3, Jan. 27, 2019 (Jan. 27, 2019), 10 pages.

(Continued)

*Primary Examiner* — Katherine A Christy
(74) *Attorney, Agent, or Firm* — Maier & Maier, PLLC

(57) ABSTRACT

A chemical vapor deposition (CVD) method for preparing a layer comprising refractory carbide crystals, in particular silicon carbide crystals. At least a portion of the layer is formed from a gas mixture containing a silicon source and an aromatic carbon source. The molar C/Si ratio in the gas mixture is from about 0.85 to about 1.45. Also, layers obtainable by the method, as well as their uses and applications in various industries.

11 Claims, 7 Drawing Sheets

(56) References Cited

OTHER PUBLICATIONS

Lai, Y. et al., "Fine-grained 3C-SiC thick films prepared via hybrid laser chemical vapor deposition", Journal of the American Ceramic Society, vol. 102, 2019, pp. 5668-5678, 12 pages.

Long, Y. et al., "Deposition Rate, Texture, and Mechanical Properties of SiC Coatings Produced by Chemical Vapor Deposition at Different Temperatures", International Journal Applied Ceramic Technology vol. 10, 2013, No. 1, pp. 11-19, 10 pages.

Tu, R. et al., "Ultra-Fast Fabrication of <110>-Oriented β-SiC Wafers by Halide CVD", Journal of the American Ceramic Society, vol. 99, 2016, No. 1, pp. 84-88, 6 pages.

Mingxu Han et al., "High-speed deposition of SiC thick film by halide precursor", Key Engineering Materials vol. 616 (2014) pp. 37-42, 8 pages.

Tu et al., "Preparation of ultra-thick β-SiC films using different carbon sources", Materials Research Innovations, 2015, 19, 397-402, 6 pages.

Chin et al., "The Structure of Chemical Vapor Deposited Silicon Carbide" Thin Solid Films, 40 (1977) 57-72, 16 pages.

Kim et al., "Effect of reactant depletion on the microstructure and preferred orientation of polycrystalline Sic films by chemical vapor deposition" Thin Solid Films 266 (1995) 192-197, 6 pages.

Cheng et al., "Preparation of highly oriented β-SiC bulks by halide laser chemical vapor deposition", Journal of the European Ceramic Society 37 (2017) 509-515, 7 pages.

Murakawa et al., "Synthesis of SiC coating from SiO by a chemical vapor deposition (CVD) process", Journal of the Ceramic Society of Japan, 125 (2017) 85-87, 3 pages.

Lai et al., "Fine-grained 3C-SiC thick films prepared via hybrid laser chemical vapor deposition", Journal of the American Ceramic Society, 2019, 1-11, 11 pages.

* cited by examiner

REFRACTORY CARBIDE LAYER

FIELD

The present disclosure relates to a novel CVD method for preparing a layer comprising refractory carbide crystals, the layers obtainable by said method and their various uses and applications, for instance deposited on a wafer carrier.

BACKGROUND

Refractory carbide coated and in particular silicon carbide (SiC) coated graphite parts are regularly used e.g. in LED fabrication and semiconductor processing. These processes require highly pure parts, therefore the refractory coating is usually applied via the chemical vapor deposition process (CVD). In CVD, for depositing a SiC layer, a gas mixture containing a carrier gas (e.g. $H_2$) and precursor gases (such as $SiCl_4+CH_4$) are fed into a reactor heated to more than 1000° C., where the precursors undergo chemical reactions and form solid SiC on the surface of the placed graphite parts. Commonly used precursors for SiC CVD on graphite parts are: Methyl trichlorosilane ($Cl_3SiCH_3$, 'MTS'); and silicon tetrachloride ($SiCl_4$) in combination with short hydrocarbons like methane ($CH_4$), ethylene ($C_2H_4$), or propane ($C_3H_8$).

The CVD process yields SiC coatings with a specific crystal structure (usually β-SiC, also referred to as 3C-SiC). These crystals can be randomly oriented in the coating or can be oriented in a preferred direction. The orientation is a result of complex interactions during the SiC growth. Usually, the SiC crystals deposited on a substrate (e.g. graphite or silicon) show no strong preferred orientation or are oriented in a way that the (220)-plane of the SiC crystals is parallel to the substrate surface ('(220)-oriented'). Attempts for improving refractory carbide coatings in the past were very much focused on refractory carbide XRD characteristics, as is understood from the prior art cited in the following paragraphs.

Tu et al., J. Am. Ceram. Soc., 99 [1] 84-88 (2016) describe an ultra-fast fabrication of <110>-oriented β-SiC wafers by halide CVD. Halide chemical vapor deposition was carried out with tetrachlorosilane ($SiCl_4$) and methane ($CH_4$) as precursors. Surface morphology of β-SiC films prepared at a very high deposition temperature of 1773 K and total pressure of 40 kPa (a) resulted in a hexagonal structure. The hexagonal structure seems to contain large hexagonal crystals. A figure shows that the distance from one corner to an opposite corner of the hexagon is a huge multiple of 5 μm.

Han et al., Key Engineering Materials Vol. 616 (2014) pp 37-42, describe a high-speed deposition of SiC thick film by halide precursor. Using tetrachlorosilane ($SiCl_4$) and methane ($CH_4$) as precursors, at deposition temperature of 1573 K, the film showed a strong <111> preferred orientation. Nevertheless, the XRD patterns of β-SiC films prepared at 1573 K had a significant (220) diffraction peak. It is said that the surface morphology of β-SiC film deposited at 1573 K exhibited pyramids with six-fold symmetry. However, it appears that a hexagon drawn into one of the SEM images does not fit to the corresponding grain.

Tu et al., Materials Research Innovations, 2015, 19, 397-402, describes the preparation of ultra-thick β-SiC films by halide chemical vapour deposition. $SiCl_4$ was used as a silicon source, whereas methane ($CH_4$), acetylene ($C_2H_2$), propane ($C_3H_8$) and liquid petroleum gas were used as carbon sources, respectively. It is explained that after CVD under certain conditions including a deposition temperature of 1473 K and the carbon source $CH_4$, only {111} peaks would have been identified in XRD. In a low deposition temperature region (<1473 K), the morphology of β-SiC films showed a smooth laminar structure. In a high deposition temperature region (1573-1773 K), cauliflower-liked, rounded hillocks and multiply-twined crystals were obtained with different carbon sources.

Long et al., International Journal of Applied Ceramic Technology, Vol. 10, No. 1, p. 11-19 (2013), produced SiC coatings on carbon/carbon (C/C) composites substrates using chemical vapor deposition (CVD) at different temperatures (1100° C., 1200° C., and 1300° C.). A methyltrichlorosilane (MTS, $CH_3SiCl_3$)—$H_2$—Ar gas system was used for chemical reaction. All X-ray diffraction patterns of SiC coatings produced at different deposition temperatures had strong (220) reflections which indicates only a certain preference for (111) orientations. Although it is stated that well-developed faceted structures were obtained for the coatings produced at 1200° C., the SEM images overall indicate high heterogeneity of crystal surfaces. The authors have also investigated mechanical properties and concluded that the (111) texture plays a significant role in determining the mechanical properties, whereas grain size, crystallinity, and stacking faults density are less important. The highest value of hardness (41±2 GPa) was obtained from the coating produced at 1200° C.

Chin et al., Thin Solid Films, 40 (1977) 57-72 describe a large number of SiC coatings, each formed from MTS at other conditions. In most coatings deposited at lower deposition temperatures, the plane of preferred orientation (cubic indices) is indicated as (111). Occasionally, hexagonal cross section crystals were obtained in run 71 at a deposition temperature of 1400° C.

Kim et al., Thin Solid Films 266 (1995) 192-197 indicates a preference of (111)-orientation in SiC coatings from MTS and $H_2$ on graphite can be obtained, when the precursor in the gas phase is partly depleted. Structure of SiC surfaces is not shown at sufficient resolution for concluding on specific structural surface features, such as polygons.

Cheng et al., Journal of the European Ceramic Society 37 (2017) 509-515 describe the preparation of highly oriented β-SiC bulks by halide laser chemical vapor deposition. One surface SEM image of a bulk prepared at total pressure of 10 kPa and at a deposition temperature of 1573 K appears to show large six-fold surface morphology with crystal cross section diameters of about 50 μm. These had a hardness of only about 33 GPa. Another recent publication (Lai et al., Journal of the American Ceramic society, 2019, 1-11) describes fine-grained 3C-SiC thick films prepared via hybrid laser chemical vapor deposition. These had improved Vickers microhardness values of the 3C-SiC thick films from 30 to 35 GPa.

While it appears that more beneficial punctual properties of refractory carbide layers were in some cases achieved by laser CVD, this method cannot be applied in an efficient way for coating larger surfaces.

Murakawa et al., Journal of the Ceramic Society of Japan 125 (2017) 85-87 disclose a CVD deposition process in which gaseous SiO and toluene vapor are reacted to generate SiC in the presence of iron oxide as a catalytic component. The process is experimental and the resulting coating is not endowed with a particular preference of SiC crystal orientation as evident in the XRD pattern. Moreover, the process may not be suitable in many commercial settings since it produces a fibrous byproduct and yields a coating comprising Fe.

There is an unmet need for refractory carbide layers that can be made in an efficient process and that provide very high mechanical stability and etch resistivity.

The present disclosure aims at addressing one or more of the aforementioned problems.

SUMMARY

In a first aspect, the present disclosure relates to a chemical vapor deposition (CVD) method for preparing a layer comprising silicon carbide crystals. At least part of the layer is formed from a gas mixture containing a silicon source and an aromatic carbon source. The molar C/Si ratio in said gas mixture is from about 0.85 to about 1.45, more specifically from about 0.9 to about 1.3, and in particular from about 1.0 to about 1.2.

In some embodiments, the aromatic carbon source may be a $C_6$ to $C_{30}$ aromatic compound. In some embodiments, the aromatic compound may be an aromatic compound selected from benzene, a $C_1$-$C_6$-alkyl benzene, a di-$C_1$-$C_6$-alkyl benzene, a tri-$C_1$-$C_6$-alkyl benzene, a tetra-$C_1$-$C_6$-alkyl benzene, a biphenyl derivative, a diphenylmethane derivative and a naphthalene derivative; more specifically a compound selected from benzene, toluene, ethylbenzene, p-xylene, o-xylene, m-xylene, mesitylene, durene, 2-phenylhexane, biphenyl, diphenylmethane and naphthalene; and in particular toluene.

In some embodiments, the reaction temperature may be from about 900 to about 1800° C., more specifically from about 1000 to about 1400° C., and in particular from about 1100 to 1200° C.

In some embodiments, the reaction may be carried out under reduced pressure, more specifically from about 0 to about 300 mbar, more specifically from about 50 to about 200 mbar, and in particular from about 75 to about 150 mbar. In some embodiments, the gas mixture may further comprise an carrier gas such as $H_2$ or Ar. In some embodiments, said gas carrier in a molar ratio of the inert carrier gas to Si of from about 10 to about 40, more specifically from about 15 to about 35, and in particular from about 20 to about 30.

In some embodiments, the method may yield a free-standing layer. In some embodiments, the method may comprise depositing the layer onto a carbonaceous substrate such as graphite, in particular a wafer carrier comprising graphite; or onto a siliconaceous substrate, in particular a semiconductor material comprising silicon such as a wafer; or onto a layer comprising refractory metal carbides such as silicon carbide.

In a second aspect, the present disclosure relates to a layer comprising silicon carbide crystals. The layer may be produced or producible by the method described in the first aspect of the present disclosure. The layer comprises, in an SEM image analysis of a cross section of the layer, at most about 20% of the surface of the cross section area has a pattern of parallel lines tilted by more than 15° with respect to a portion of a surface of the layer which is closest to the respective image.

In some embodiments, the surface of the layer may comprise silicon carbide crystal tops having a regular hexagonal pyramid shape, and less than 10% of the surface is occupied by large crystal tops having a regular hexagonal pyramid shape wherein a distance from one corner of a regular hexagonal base of the top to an opposite corner of the base is at least about 25 µm. Additionally or alternatively, the layer may be characterized by a Raman spectrum of the layer comprising two overlapping peaks, a first of these peaks having its maximum intensity in a range from 758 to 778

$cm^{-1}$, a second of these peaks having its maximum intensity in a range from 785 to 805 $cm^{-1}$, and a surface area ratio calculated by dividing a first surface area of the first peak by a second surface area of the second peak is at least about 0.05.

In some embodiments, a fraction of at least 10% of the surface of the layer may be covered by the tops having the regular hexagonal pyramid shape.

In some embodiments, the layer may comprise a distribution of silicon carbide crystal orientations such that an orientational quality Q is at least about 0.90, specifically at least about more specifically at least about 0.97, and in particular at least about 0.99, wherein the orientational quality Q is calculated from maximum peak intensities of an X-ray diffractogram detected with Cu k-alpha radiation at 1.5406 Å wavelength, according to the following formula $$Q = \frac{I_{111} + I_{222} + I_{333/511}}{I_{111} + I_{200} + I_{220} + I_{311} + I_{222} + I_{400} + I_{331} + I_{420} + I_{333/511} + I_{422}}$$

wherein $I_{111}$ is the maximum intensity at $2\theta$ ranging from 34.6° to 36.6°, $I_{200}$ is the maximum intensity at $2\theta$ ranging from 40.4° to 42.4°, $I_{220}$ is the maximum intensity at $2\theta$ ranging from 59.0° to 61.0°, $I_{311}$ is the maximum intensity at $2\theta$ ranging from 70.8° to 72.8°, $I_{222}$ is the maximum intensity at $2\theta$ ranging from 74.5° to 76.5°, $I_{400}$ is the maximum intensity at $2\theta$ ranging from 89.0° to 91.0°, $I_{331}$ is the maximum intensity at $2\theta$ ranging from 99.8° to 101.8°, $I_{420}$ is the maximum intensity at $2\theta$ ranging from 103.4° to 105.4°, $I_{333/511}$ is the maximum intensity at $2\theta$ ranging from 132.4° to 134.4°, $I_{422}$ is the maximum intensity at $2\theta$ ranging from 119.0° to 121.0°.

In some embodiments, surface of the layer may have a mean linear intercept surface grain size in a range from about 0.2 to about 25 µm, more specifically from about 0.4 to about 10 µm, and in particular from about 0.6 to about 5 µm.

In some embodiments, the surface hardness of the layer may be at least about 0.5% higher than the cross-sectional hardness of the layer, more specifically at least about 1% higher and in particular at least about 2% higher.

In some embodiments, the average roughness Ra according to ISO 4287 of one surface of the layer may be in a range from about 0.01 nm to about 100 nm, more specifically from about 0.2 nm to about 50 nm, in particular from about 0.4 nm to about 25 nm (nanoscale roughness). Additionally or alternatively, the average roughness Ra according to ISO 4287 of one surface of the layer may be in a range from about 100 nm to about 10 µm, more specifically from about 200 nm to about 8 µm, in particular from about 300 nm to about 6 µm (microscale roughness).

In some embodiments, the thickness of the layer may be at least about 0.5 µm, more specifically at least about 1 µm, and in particular at least about 10 µm.

In a third aspect, the present disclosure, there is provided a layer comprising silicon carbide crystals, wherein a distribution of silicon carbide crystal orientations is such that an orientational quality Q is at least about 0.90, specifically at least about 0.95, more specifically at least about 0.97, and in particular at least about 0.99, wherein the orientational quality Q is calculated from maximum peak intensities of an X-ray diffractogram detected with Cu k-alpha radiation at 1.5406 Å wavelength, according to the following formula $$Q = \frac{I_{111} + I_{222} + I_{333/511}}{I_{111} + I_{200} + I_{220} + I_{311} + I_{222} + I_{400} + I_{331} + I_{420} + I_{333/511} + I_{422}}$$

wherein $I_{111}$ is the maximum intensity at $2\theta$ ranging from 34.6° to 36.6°, $I_{200}$ is the maximum intensity at $2\theta$ ranging from 40.4° to 42.4°, $I_{220}$ is the maximum intensity at $2\theta$ ranging from 59.0° to 61.0°, $I_{311}$ is the maximum intensity at $2\theta$ ranging from 70.8° to 72.8°, $I_{222}$ is the maximum intensity at $2\theta$ ranging from 74.5° to 76.5°, $I_{400}$ is the maximum intensity at $2\theta$ ranging from 89.0° to 91.0°, $I_{331}$ is the maximum intensity at $2\theta$ ranging from 99.8° to 101.8°, $I_{420}$ is the maximum intensity at $2\theta$ ranging from 103.4° to 105.4°, $I_{333/511}$ is the maximum intensity at $2\theta$ ranging from 132.4° to 134.4°, $I_{422}$ is the maximum intensity at $2\theta$ ranging from 119.0° to 121.0°.

In some embodiments, this layer may be further endowed with features as described for the second aspect of the present disclosure.

In a fourth aspect, the present disclosure relates to a device for high temperature applications, in particular a wafer carrier. The device comprises a layer according to the second or third aspect of the present disclosure. The layer is provided on a surface of the device.

In a fifth aspect, the present disclosure relates to the use of a layer according to the second or third aspect of the present disclosure for supporting a semiconductor material.

6

DETAILED DESCRIPTION OF THE PRESENT DISCLOSURE

Figure 1:
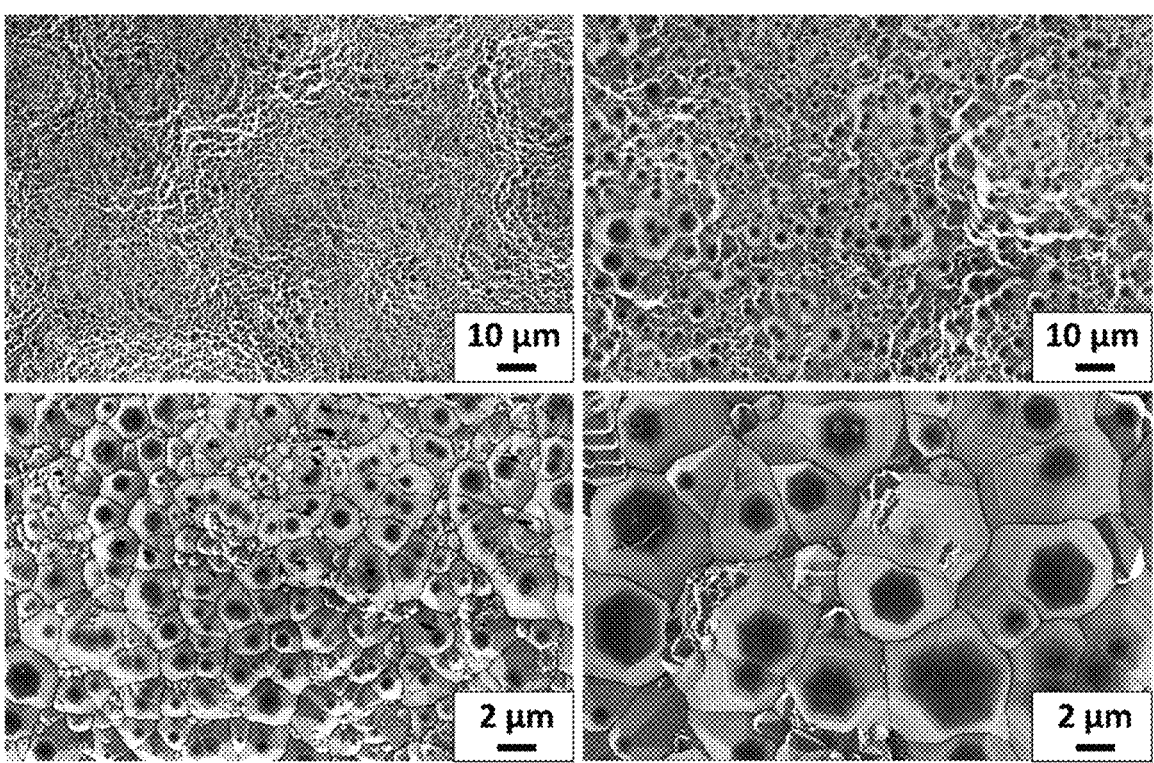
FIGS. 1, 5A, 5B, 6, and the left panels of FIG. 8 show top-view scanning electron microscopy (SEM) images of different layers of the present disclosure.

Coatings comprising the cubic polytype of silicon carbide (3C-SiC) are endowed with high hardness and strength, good thermal shock resistance and corrosion resistance. The present inventors have surprisingly found that the mechanical and chemical properties of a (polycrystalline) silicon carbide coating can be improved by using an optimized CVD deposition process using an aromatic carbon source. The method is capable of producing large SiC deposits and is suitable for large scale productions. Despite the poor results reported in the aforementioned article by Murakawa et al., Journal of the Ceramic Society of Japan 125 (2017) 85-87, the present inventors have surprisingly succeeded in optimizing the reaction conditions such that highly uniform and {111}-oriented silicon carbide crystals can be deposited in large scale on variety of substrates. Due to the uniformity and very high {111}-orientation of the silicon carbide crystals, the coatings are endowed with excellent mechanical and chemical properties.

In a first aspect, the present disclosure relates to a chemical vapor deposition (CVD) method for preparing a layer comprising silicon carbide crystals. At least part of the layer is formed from a gas mixture containing a silicon source and an aromatic carbon source.

The molar C/Si ratio in said gas mixture is from about 0.85 to about 1.45, more specifically from about 0.9 to about 1.3, and in particular from about 1.0 to about 1.2. The molar ratio is meant to refer to the total number of carbon atoms (in mol or mol/l) to the total number of silicon atoms (in mols or mol/l) of the gas mixture as present in the reaction chamber. It should be understood that the gas mixture may be premixed or independently fed individually to the reaction vessel.

In some embodiments, it may be advantageous that the gas further comprises a halogen source. Suitable halogen sources are well-known in the art and may include fluoride atoms, chloride atoms and bromide atoms. Specific examples include hydrogen chloride and hydrogen bromide.

In some embodiments, the silicon source may comprise an Si—X bond, where X is a hydrogen atom, a hydrocarbyl residue, such as $C_1$-$C_{12}$-hydrocarbyl residue, or a halogen atom, such as chloride atom or bromide atom; or mixtures thereof. In particular, the silicon source may comprise one or more $C_1$-$C_4$-hydrocarbyl residues such as methyl or ethyl; one or more halogens such as chloride; or mixtures thereof.

In some embodiments, it may be advantageous that at least part of the silicon source and at least part of the halogen source are part of the same constituent of the gas, for example, when the silicon source comprises an Si—X bond, wherein X is a halogen atom.

In some embodiments, it may be particularly advantageous that the silicon source is $SiCl_4$.

In some embodiments, the aromatic carbon source may be a $C_6$ to $C_{30}$ aromatic compound. In some embodiments, the aromatic compound may be an aromatic compound selected from benzene, a $C_1$-$C_6$-alkyl benzene, a di-$C_1$-$C_6$-alkyl benzene, a tri-$C_1$-$C_6$-alkyl benzene, a tetra-$C_1$-$C_6$-alkyl benzene, a biphenyl derivative, a diphenylmethane derivative and a naphthalene derivative; more specifically a compound selected from benzene, toluene, ethylbenzene, p-xylene, o-xylene, m-xylene, mesitylene, durene, 2-phenylhexane, biphenyl, diphenylmethane and naphthalene; and in particular toluene.

In some embodiments, the reaction may be carried out under reduced pressure, more specifically from about 0 to about 300 mbar, more specifically from about 50 to about 200 mbar, and in particular from about 75 to about 150 mbar. Alternatively, the CVD pressure may be in a range from 10 to 600 mbar, more preferably 25 mbar to 400 mbar. However, it should be understood that—in particular for the highly volatile reactants—it is not necessary to work under reduced pressure. Accordingly, in some embodiments, the reaction may be carried out under ambient pressure (e.g. about 1 bar).

In some embodiments, the gas mixture may further comprise an carrier gas such as $H_2$ or Ar. In some embodiments, said gas carrier in a molar ratio of the carrier gas to Si of from about 10 to about 40, more specifically from about 15 to about 35, and in particular from about 20 to about 30. The molar ratio may be determined as described above.

In some embodiments, the reaction temperature may be from about 900 to about 1800° C., more specifically from about 1000 to about 1400° C., and in particular from about 1100 to 1200° C. In some embodiments, the CVD method of the invention may involve thermal CVD. Thermal CVD is different from plasma enhanced chemical vapor deposition (PECVD). Thermal CVD typically requires much higher temperatures than PECVD, but does not require a plasma source. The expression "thermal CVD" herein refers to CVD at a temperature of at least 800° C., for example in a temperature range from 1000 to 1400° C.

In some embodiments, it may be particularly advantageous that the method is a thermal CVD method, wherein the (entire) layer is deposited at temperatures of 800° C. or higher, for example in a temperature range from 1000 to 1400° C.

In some embodiments, the method may yield a free-standing layer. A free-standing layer may be provided by depositing the layer onto a substrate, followed by detaching the layer from the substrate.

In some embodiments, the method may comprise depositing the layer onto a carbonaceous substrate such as graphite, in particular a wafer carrier comprising graphite; or onto a siliconaceous substrate, in particular a semiconductor material comprising silicon such as a wafer; or onto a layer comprising refractory metal carbides such as silicon carbide.

In a second aspect, the present disclosure relates to a layer comprising silicon carbide crystals. The layer may be produced or producible by the method described in the first aspect of the present disclosure.

Figure 10:
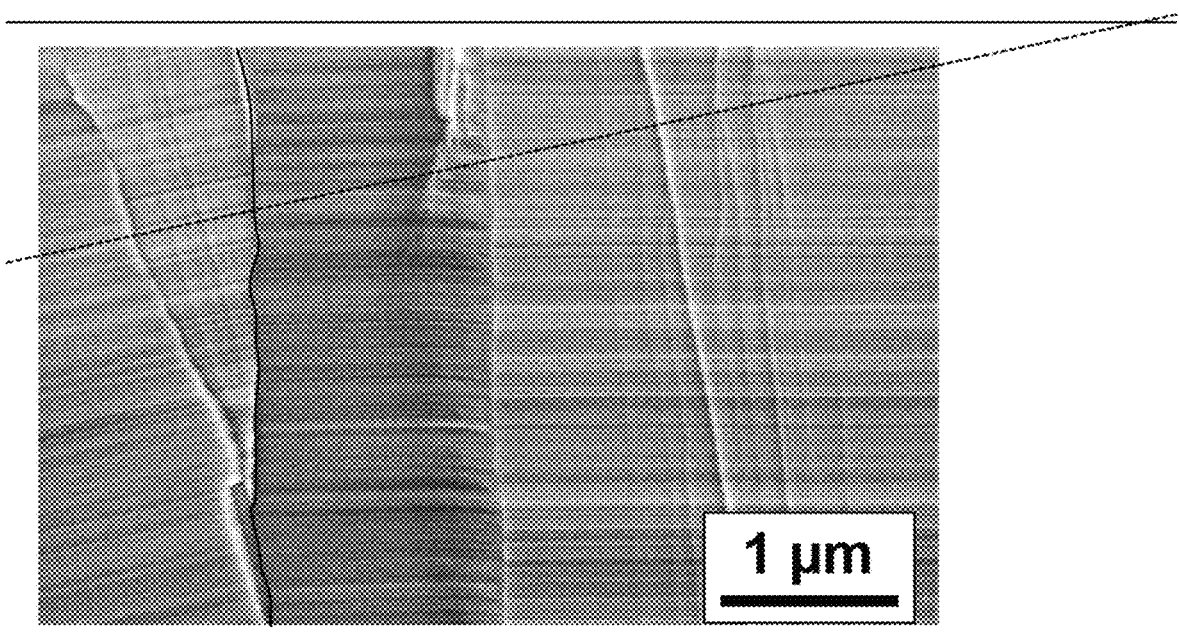
FIG. 10 illustrates parallel line patterns in a cross-section SEM image.

The layer comprises, in an SEM image analysis of a cross section of the layer, at most about 20% of the surface of the cross section area has a pattern of parallel lines tilted by more than 15° with respect to a portion of a surface of the layer which is closest to the respective image. This feature has to be understood in the context of the CVD deposition process. It is representative of a highly oriented {111}-SiC deposition and means that SiC have been preferentially deposited with {111}-orientation i.e. with lines (growth lines or columnar grains or twinning lines) visible in a cross-sectional REM image parallel or substantially parallel to the surface coated in the CVD process. In other words, the feature defines that in an SEM image analysis of a cross section of the layer, the analyzed cross-section is characterized by at least 80% of the surface of the cross section area has a pattern of parallel lines tilted by less than 15° with respect to a portion of a surface of the layer which is closest to the respective image. The preparation and analysis of such cross-sectional cuts is well-established in the art. For instance, the feature may be determined as follows: Any unevenness of the surface of the layer is ignored, i.e. the angle is measured between a straight line which is parallel to the respective portion of the surface and another straight line which is parallel to the parallel lines of a pattern. In case of a layer that is not flat but comprises edges, the SEM image analysis is nor carried out at an edge. This can be determined very easily by analyzing a representative number of SEM images of the cross section. One example of an SEM image of a cross section is shown in FIG. 10. The cross section comprises sections of different crystals. Each section of a crystal has a characteristic pattern of parallel lines. It is assumed that parallel lines are caused by twinning planes within the silicon carbide crystals. In each section of a crystal, the lines are tilted by a defined angle with respect to a surface of the layer. More specifically, the cross-sectional analysis may also be carried out by preparing a cross-sectional cut perpendicular to the surface of the silicon carbide layer; obtaining a SEM image of a cross-sectional area of at least about 1000 $\mu m^2$ in size which also include the edge to the surface of the layer; performing image analysis of the SEM image to define a line running substantially parallel to the imaged edge to the surface of the layer; selecting a representative number of locations of the imaged cross-sectional area (e.g. a random selection of 10 locations distributed over said imaged cross-sectional area); for each representative location, performing image analysis of the representative number of locations to identify the area occupied with parallel lines tilted by less than 15° with respect to the line defined as running substantially parallel to the imaged edge to the surface of the layer; for each representative location, performing image analysis to determine the area-% of said area in relation to the total area of the representative location; determine the surface of the cross section area having a pattern of parallel lines tilted by less than 15° with respect to a portion of a surface of the layer by calculating the average area-% over all representative locations.

In some embodiments, it may be advantageous that, in an SEM image analysis of a cross section of the layer, at most 18%, specifically at most 16%, more specifically at most at most 14%, and in particular at most 12%, of the surface of the cross section area has a pattern of parallel lines tilted by more than 15° with respect to a portion of a surface of the layer which is closest to the respective image.

The layer comprising silicon carbide crystals may be characterizable by further features as follows:

In some embodiments, a surface of the layer comprises silicon carbide crystal tops having a regular hexagonal pyramid shape, and less than 10% of the surface is occupied by large crystal tops having a regular hexagonal pyramid shape wherein a distance from one corner of a regular hexagonal base of the top to an opposite corner of the base is at least 25 $\mu m$ (surface property);

and/or the layer comprises silicon carbide crystals and a Raman spectrum of the layer comprises two overlapping peaks, a first of these peaks having its maximum intensity in a range from 758 to 778 $cm^{-1}$, a second of these peaks having its maximum intensity in a range from 785 to 805 $cm^{-1}$, and a surface area ratio calculated by dividing a first surface area of the first peak by a second surface area of the second peak is at least 0.05, specifically at least 0.06, in particular at least 0.08, e.g., at least 0.12 (Raman spectral property). The surface area ratio is specifically at most 1.50, more specifically at most 1.30, and in particular at most 1.10, e.g. at most 0.90 or even only at most 0.60. Any of these lower and upper boundaries can delimit a surface area ratio range. 0.05 to 1.50, 0.12 to 1.50, 0.05 to 0.60, and 0.12 to 0.60 are some examples of specific ranges based on specific upper and lower boundaries.

The layer of the present disclosure may thus be described by three properties which are indicated above and which are abbreviated herein as "surface property", "cross section property" and "Raman spectral property". However, it should be understood that these properties do not interchangeably define the same coating, i.e. a coating characterized by e.g. the "Raman spectral property" does not necessarily also demonstrate e.g. the "surface property". Likewise, the presence of the "Raman spectral property" or the "surface property" does not necessarily mean that the "cross section property" is also realized. As another example, the "surface property" may be removed by polishing the surface while the "cross section property" is retained.

It is understood from the examples which are provided hereinbelow, that layers made by the method of the present disclosure may possess all three properties, i.e. the "surface property", the "cross section property", and the "Raman spectral property".

The present disclosure also relates to a layer comprising refractory carbide crystals. Refractory carbides are well known to skilled persons in the technical fields of surface coatings in general or chemical vapor deposition (CVD). Refractory carbides contain a non-carbon carbide-component and carbon. In silicon carbide, for example, the non-carbon carbide-component is silicon. As is apparent from the further specification below, the present disclosure is not limited to a specific refractory carbide and silicon carbide is only (albeit important) example. For this reason, we will in the following refer to refractory carbides which is in particular but not exclusively intended to refer to silicon carbide.

As stated in connection with the surface property, a surface of the layer comprises refractory carbide crystal tops having a regular hexagonal pyramid shape. The expression "regular hexagonal pyramid" has its common meaning in the art. It refers to a pyramid having a regular hexagonal base, i.e. a hexagonal base where all six angles are equal in measure and all six sides have same length. The tops of the refractory carbide crystal are parts of crystals visible in SEM images of the surface. The total height of the crystal is usually much larger than the height of the surface exposed pyramid top. Many crystals are oriented almost or exactly orthogonal to the surface and the tops of these crystals visible in SEM images thus match very well with the hexagonal pyramid shapes used for describing the "surface property" of layers of the present disclosure. In some embodiments, the hexagonal pyramid shapes may be faceted.

As further stated in connection with the surface property, less than 10% of the surface is occupied by large crystal tops having a regular hexagonal pyramid shape, wherein a distance from one corner of a regular hexagonal base of the top to an opposite corner of the base is at least 25 μm. The amount of surface occupied by such large crystal tops can be determined very easily by analyzing a representative number of SEM images of the surface. Every portion of the surfaces that is covered by a single crystal top which fully occupies a regular hexagonal base with distance of 25 μm or more from one corner of the base to an opposite corner of the base, forms part of the specified surface occupied by large crystal tops. Other portions of the surface are not considered surface occupied by large crystal tops.

When it is determined if a certain percentage of the surface is occupied by large crystal tops, any unevenness of the surface, such as unevenness of the surface caused by slopes of pyramidal crystal tops, is not considered. When a percentage of the surface is determined, the surface is considered perfectly flat. Thus, top view SEM images can be analyzed for determining if a required percentage is met by a specific layer under consideration.

The term "hexagonal", as used herein, does not refer to the atomic lattice stacking within crystals. The term "hexagonal" herein refers to the outer shape of crystals or parts of crystals visible in SEM images, not to their crystal family.

In some embodiments, less than 9%, more specifically less than 8%, and in particular, less than 7%, e.g. less than 6% of the surface is occupied by large crystal tops having a regular hexagonal pyramid shape, wherein a distance from one corner of a regular hexagonal base of the top to an opposite corner of the base is at least 25 μm.

The Raman spectral property defines the layer of the present disclosure by two overlapping peaks in a Raman spectrum of the layer. A Raman spectrum referred to herein is obtained by perpendicularly illuminating an exposed surface of the layer with an Ar-laser operating at a wavelength of 532 nm and at a power of 10 mW. The surface areas of both peaks can be derived from the Raman spectrum by fitting the intensity in the range from about 730 to about 840 $cm^{-1}$ with two lines of appropriate shape, e.g. by a linear combination of Gaussian and Lorentzian functions, as exemplified below. The first of the peaks has its maximum intensity typically in a range from 763 to 774 $cm^{-1}$, more specifically 765 to 772 $cm^{-1}$, e.g. 767 to 770 $cm^{-1}$, and the second of these peaks has its maximum intensity typically in a range from 790 to 801 $cm^{-1}$, more specifically 792 to 799 $cm^{-1}$, e.g. 794 to 797 $cm^{-1}$.

In some embodiments, a fraction of at least 10%, specifically at least 15%, more specifically at least 20%, and in particular at least 25% of the surface is covered by the tops having the regular hexagonal pyramid shape. This fraction includes all tops having the regular hexagonal pyramid shape, irrespective of the size of the tops or their hexagonal pyramid base. This indicates high crystalline quality and a high degree of preferred orientation, which enhances hardness. Without wishing to be bound by theory, it is assumed that etch resistivity is improved. An increase of this fraction is an indication of approaching a honeycomb like arrangement of crystals with hexagonal bases. Again without wishing to be bound by theory, it is assumed that such more regular arrangement of crystals would decrease the number of deep pitches and thus the likelihood of corrosion.

In some embodiments, the layer of the present disclosure has a surface having a mean linear intercept surface grain size (as defined in ISO 13383-1:2012 (EN)) in a range from 0.2 to 25 μm, typically from 0.4 to 20 μm, e.g. from 0.5 to 15 μm. Without wishing to be bound by theory, it is assumed that this provides beneficial etch behavior: The aforementioned size range describes relatively large crystal sizes. Many smaller crystals would be etched quicker due to longer grain boundaries, a smaller number of larger crystals would favor larger and sometimes wedge-shaped gaps favoring penetration of significant amounts of etching gases deep into the layer. In some embodiments, it may be particularly advantageous that the layer of the present disclosure has a surface having a mean linear intercept surface grain size (as defined in ISO 13383-1:2012 (EN)) in a range from 1 to 20 μm, more specifically from 1.2 to 15 μm, and in particular from 2 to 10 μm.

In some embodiments, the refractory carbide is selected from silicon carbide, tantalum carbide, niobium carbide, hafnium carbide, tungsten carbide, boron carbide, tantalum niobium carbide, tantalum hafnium carbide, titanium carbide, and niobium hafnium carbide; in particular selected from silicon carbide, tantalum carbide, niobium carbide, titanium carbide, and hafnium carbide. As indicated above, it may be particularly advantageous that the refractory carbide is silicon carbide. The refractory carbide crystals are in particular silicon carbide crystals.

As said, independent of the specific context, the term "refractory carbide" as used herein specifically refers to "silicon carbide". Although specific effects were shown herein in particular for silicon carbide, it is reasonable that same or similar effects are also observed for other refractory carbides, as the growth of these refractory carbides in CVD follows same or similar physical principles as shown in the below examples.

In some embodiments, a maximum peak intensity $I_{220}$ is at most 10%, specifically at most 8%, more specifically at most 7%, even more specifically at most 6%, and in particular at most 5% of a maximum peak intensity $I_{111}$ in an x-ray diffractogram of the layer detected with Cu k-alpha radiation at 1.5406 Å wavelength. This results in high crystalline quality and strong crystalline orientation. The (111) plane is the most densely packed plane in the cubic crystal system. Having this plane oriented parallel to the surface results in higher mechanical stability and improved corrosion resistance. Without wishing to be bound by theory, the inventors assume that this increases the number of crystals fitting exactly to neighboring crystals. As a result, deep pitches are less probable and thus corrosion may be slower.

In some embodiments, the layer according to the present disclosure may have a distribution of the silicon carbide crystal orientations which is such that an orientational quality Q which is calculated from maximum peak intensities of an x-ray diffractogram detected with Cu k-alpha radiation at 1.5406 Å wavelength, according to the following formula $$Q = \frac{I_{111} + I_{222} + I_{333/511}}{I_{111} + I_{200} + I_{220} + I_{311} + I_{222} + I_{400} + I_{331} + I_{420} + I_{333/511} + I_{422}}$$

wherein $I_{111}$ is the maximum intensity at $2\theta$ ranging from 34.6° to 36.6°, $I_{200}$ is the maximum intensity at $2\theta$ ranging from 40.4° to 42.4°, $I_{220}$ is the maximum intensity at $2\theta$ ranging from 59.0° to 61.0°, $I_{311}$ is the maximum intensity at $2\theta$ ranging from 70.8° to 72.8°, $I_{222}$ is the maximum intensity at $2\theta$ ranging from 74.5° to 76.5°, $I_{400}$ is the maximum intensity at $2\theta$ ranging from 89.0° to 91.0°, $I_{331}$ is the maximum intensity at $2\theta$ ranging from 99.8° to 101.8°, $I_{420}$ is the maximum intensity at $2\theta$ ranging from 103.4° to 105.4°, $I_{333/511}$ is the maximum intensity at $2\theta$ ranging from 132.4° to 134.4°, $I_{422}$ is the maximum intensity at $2\theta$ ranging from 119.0° to 121.0°, is at least 0.60, specifically at least 0.80, more specifically at least 0.90, even more specifically at least 0.95 and in particular at least 0.99. It is assumed that this further contributes to the hardness and corrosion resistivity of the layer.

In some embodiments, each of the intensities $I_{200}$, $I_{220}$, $I_{311}$, $I_{400}$, $I_{331}$, $I_{420}$, $I_{422}$ is at most 80%, specifically at most 60%, more specifically at most 40%, and in particular at most 30% of its corresponding reference intensity $I_{200}R$, $I_{220}R$, $I_{311}R$, $I_{400}R$, $I_{331}R$, $I_{420}R$, $I_{422}R$ that would be expected in case of random distribution of silicon carbide crystal orientations.

In some embodiments, the layer may be further characterized by a peak intensity $I_{111}$ having a full width at half maximum value (FWHM) of less than about 0.4°, more specifically less than about 0.3° and in particular less than 0.2° (at $2\theta$ with Cu k-alpha radiation at 1.5406 Å wavelength). This features represents relatively large crystals as are obtainable by the thermal CVD process according to the present disclosure which favors the growth of large crystals.

In some embodiments, it may be particularly advantageous that the layer of the present disclosure is characterized by a peak intensity $I_{111}$ having a full width at half maximum value (FWHM) of less than about 0.4°, more specifically less than about 0.3° and in particular less than 0.2° (at $2\theta$ with Cu k-alpha radiation at 1.5406 Å wavelength); and by a surface having a mean linear intercept surface grain size (as defined in ISO 13383-1:2012 (EN)) in a range from 1 to 20 μm, more specifically from 1.2 to 15 μm, and in particular from 2 to 10 μm.

In some embodiments, the layer of the present disclosure has a hardness of at least 34.0 GPa, preferably at least 34.5 GPa, e.g. at least 35.0 GPa. The hardness is measured orthogonal to the surface of the layer by nano-indentation after polishing the surface of the layer. The polished surface of which hardness is measured is the surface formed by the ends of the crystals which successively grow during the CVD method of the present disclosure. Polishing is carried out such that the tops of the crystals are flattened. The extraordinary high hardness enhances lifetime of parts coated with the layer of the present disclosure because mechanical damage during handling and use of the parts is reduced.

In some embodiments, the surface hardness of the layer is at least 0.5%, specifically at least 1%, more specifically at least 1.5%, and in particular at least 2.0% higher than the cross-section hardness of the layer. The cross-section hardness is measured by nano-indentation after polishing a cross-section of the layer. The cross-section is orthogonal to the surface or both surfaces of the layer. Without wishing to be bound by theory, it is assumed that the exceptional hardness from top is by virtue of high consistency in orientation.

The layer can be a free-standing layer or a layer on a surface of a part of a device. A free-standing layer does not comprise a substrate. None of the two main surfaces of a typical free-standing layer is attached to a substrate.

The present disclosure further relates to a device for high temperature applications, wherein the device comprises a layer of the present disclosure on a surface of a material of the device. High temperature as mentioned here typically refers to temperatures in a range from 200 to 4000° C., specifically 300 to 3000° C., and in particular 400 to 2500° C.

The material of the device is not limited. Every material that is stable at the high temperature of the high temperature application is suitable as a material of the device. In some embodiments, the material of the device comprises graphite, elemental silicon, or a refractory carbide, e.g. silicon carbide. The material of the device can, for example, be a graphite material, a carbon fiber reinforced material, or elemental silicon. The elemental silicon may in particular be in the form of a wafer, e.g., as used in semiconductor industry. The material can have the shape of a support for semiconductor applications. It is well known in the art that such supports for semiconductor applications often have the shape of a disk with one or more recesses for placing semiconductor substrates such as silicon-based wafers to be treated on the support, e.g. in epitaxy reactors or MOCVD reactors where such supports are routinely used for growing layers on wafers, or plasma etch reactors such as focused rings, or RTP reactors, i.e. RTP rings. The present disclosure thus further relates to a refractory carbide coated wafer carrier comprising or made of a layer of the present disclosure. However, the device can be any other high-temperature reactor component or high-temperature furnace component. The component, can for example, be a heater, a charging rack or part, e.g. strip, of a charging rack, a baffle, other component of a CVD chamber than a wafer carrier, e.g. a lift pin, a ceiling, or an inlet or outlet part of a CVD chamber.

The layer can also be a single layer of a multilayer. The multilayer comprises at least one other layer. Each of the one or more other layers can, for example be another refractory carbide layer or a carbon based layer. The multilayer can be a free-standing multilayer. The multilayer can also be a coating deposited on a surface of a device.

In some embodiments, the layer may be a multilayer comprising one or more layers according to the present disclosure and one or more further silicon carbide layers.

The thickness of the layer is in general at least 0.5 µm. In some embodiments, the thickness of the layer is in a range from 1 µm to 1 mm if the layer is a layer of a device, e.g. of the device specified herein. This ensures reliable protection of the material coated with the layer at reasonable deposition times and thus at reasonable costs. In some embodiments, the thickness of the layer is in a range from 100 µm to 100 mm if the layer is a free-standing layer, i.e. the free-standing layer specified herein.

In alternative embodiments, the thickness of the layer may be at least about 0.5 µm, more specifically at least about 1 µm, and in particular at least about 10 µm. In some embodiments, it may be particularly advantageous that the thickness of the layer is at least 50 µm.

The present disclosure further relates to a layer comprising refractory carbide crystals, preferably a layer as defined herein, wherein the layer is a free-standing layer and wherein the average roughness Ra (as defined in ISO 4287) of one surface of the layer is in a range from 0.01 nm to 100 nm, specifically 0.02 nm to 50 nm, in particular 0.04 nm to 25 nm, e.g. 0.08 nm to 15 nm (nanoscale roughness);

0.1 nm to 100 nm, specifically 0.2 nm to 50 nm, in particular 0.4 nm to 25 nm, e.g. 0.8 nm to 15 nm (nanoscale roughness); or from 100 nm to 10 µm, specifically 200 nm to 8 µm, in particular 300 nm to 6 µm, e.g. 400 nm to 5 µm (microscale roughness).

Nanoscale roughness is measured by atomic force microscopy. Microscale roughness is measured by profilometry. Both measurements are well-known in the art.

A layer of the present disclosure wherein one surface of the layer has nanoscale roughness can be formed by using a monocrystalline substrate, in particular monocrystalline silicon, e.g., a silicon wafer, in the method of the present disclosure, depositing the layer on the monocrystalline substrate, and removing the substrate from the layer. Removing the substrate from the layer may comprise thermal removal of the substrate from the layer, e.g. by melting the silicon. The inventors have found that the nanoscale roughness of the monocrystalline silicon surface is inherited by the surface of the layer.

A layer of the present disclosure wherein one surface of the layer has microscale roughness can be formed by using a graphite substrate, in particular an isostatic graphite substrate, in the method of the present disclosure, depositing the layer on the graphite substrate, and removing the substrate from the layer. Removing the substrate from the layer may comprise mechanical or oxidative degradation of the graphite substrate. The inventors have found that the microscale roughness of the graphite surface, which is due to the graphite grains, is inherited by the surface of the layer.

The nanoscale or microscale roughness is thus reached at the surface of the layer which, after deposition of the layer, was in contact with the substrate. While this surface of the free-standing layer matches the roughness of the substrate, the opposite surface can have the "surface property" as defined herein or a roughness obtained through standard polishing (e.g. CMP) of 0.01 nm or above.

A preferred free-standing layer of the present disclosure has one surface having nanoscale or microscale roughness as defined herein, preferably nanoscale roughness as defined herein, and, in addition, has the "surface property" as defined herein at the surface opposite to the surface having the nano scale roughness;

and/or the "cross section property" as defined herein;

and/or the "Raman spectral property" as defined herein.

The present disclosure further relates to the use of the layer, of the device or of the wafer carrier of the present disclosure, or of the layer, the device or the wafer carrier made according to the method of the present disclosure, for supporting a semiconductor material. In the case of a free-standing layer, one specific embodiment of such a free-standing layer is a wafer for further deposition of semiconductor material.

In accordance with the aforementioned disclosure, the present disclosure also provides in a third aspect a layer comprising silicon carbide crystals, wherein a distribution of silicon carbide crystal orientations is such that an orientational quality Q is at least about 0.90, specifically at least about 0.95, more specifically at least about 0.97, and in particular at least about 0.99, wherein the orientational quality Q is calculated from maximum peak intensities of an X-ray diffractogram detected with Cu k-alpha radiation at 1.5406 Å wavelength, according to the following formula $$Q = \frac{I_{111} + I_{222} + I_{333/511}}{I_{111} + I_{200} + I_{220} + I_{311} + I_{222} + I_{400} + I_{331} + I_{420} + I_{333/511} + I_{422}}$$

wherein $I_{111}$ is the maximum intensity at $2\theta$ ranging from 34.6° to 36.6°, $I_{200}$ is the maximum intensity at $2\theta$ ranging from 40.4° to 42.4°, $I_{220}$ is the maximum intensity at $2\theta$ ranging from 59.0° to 61.0°, $I_{311}$ is the maximum intensity at 2θ ranging from 70.8° to 72.8°, $I_{222}$ is the maximum intensity at 2θ ranging from 74.5° to 76.5°, $I_{400}$ is the maximum intensity at 2θ ranging from 89.0° to 91.0°, $I_{331}$ is the maximum intensity at 2θ ranging from 99.8° to 101.8°, $I_{420}$ is the maximum intensity at 2θ ranging from 103.4° to 105.4°, $I_{333/511}$ is the maximum intensity at 2θ ranging from 132.4° to 134.4°, $I_{422}$ is the maximum intensity at 2θ ranging from 119.0° to 121.0°.

In some embodiments, this layer may be further endowed with features as described for the second aspect of the present disclosure.

In a fourth aspect, the present disclosure relates to a device for high temperature applications, in particular a wafer carrier. The device comprises a layer according to the second or third aspect of the present disclosure. The layer is provided on a surface of the device.

In a fifth aspect, the present disclosure relates to the use of a layer according to the second or third aspect of the present disclosure for supporting a semiconductor material.

The present disclosure is explained in more detail by the following non-limiting figures and examples.

Example 1—Growth on Graphite With Varying Temperature (Samples 1 and 2)

Isostatic graphite substrates were coated with silicon carbide in a CVD reactor. The CVD reactor consisted of an inductively heated SiC-coated graphite susceptor, insulated by graphite felt (MFA insulation from SGL Carbon) and placed in a quartz tube. The inlet side of the reactor was connected to a gas supply system, providing the carrier gas $H_2$, and the precursors silicon tetrachloride and toluene. The outlet of the reactor is connected via a throttle valve to a vacuum pump and a scrubbing system.

Two graphite substrates were each coated with one layer of the present disclosure comprising silicon carbide crystals. The layers were formed under the CVD growth conditions summarized in Table 1.

TABLE 1

CVD growth conditions for samples 1 and 2.

| | T/° C. | p/mbar | H₂/Si molar ratio (gas phase) | C/Si molar ratio (gas phase) |
|---|---|---|---|---|
| Sample 1 | 1100 | 100 | 23 | 1 |
| Sample 2 | 1200 | 100 | 23 | 1 |

The surface of the coated samples is covered with well-facetted SiC crystals of hexagonal shape. Silicon carbide crystal tops having a regular hexagonal pyramid shape can be seen in FIG. 1 on layers of both, samples 1 (left panels) and 2 (right panels). As the crystal tops are rather small, it is immediately apparent that less than 10% of the surface is occupied by large crystal tops having a regular hexagonal pyramid shape wherein a distance from one corner of a regular hexagonal base of the top to an opposite corner of the base is at least 25 μm. This morphology is present on the major part of the surface and is homogeneous at least over the part inspected via SEM. The dark spots in the center of the crystals are artifacts due to charging effects and are not present if the sample is sputter coated with a conductive metal prior to SEM inspection. The grain size at the surface increased with deposition temperature. Mean linear intercept grain size (defined in ISO 13383-1:2012 (EN)) of sample 1 prepared at 1100° C. was 1.2 μm. Mean linear intercept grain size of sample 2 prepared at 1200° C. was 2.6 μm.

Figure 2:
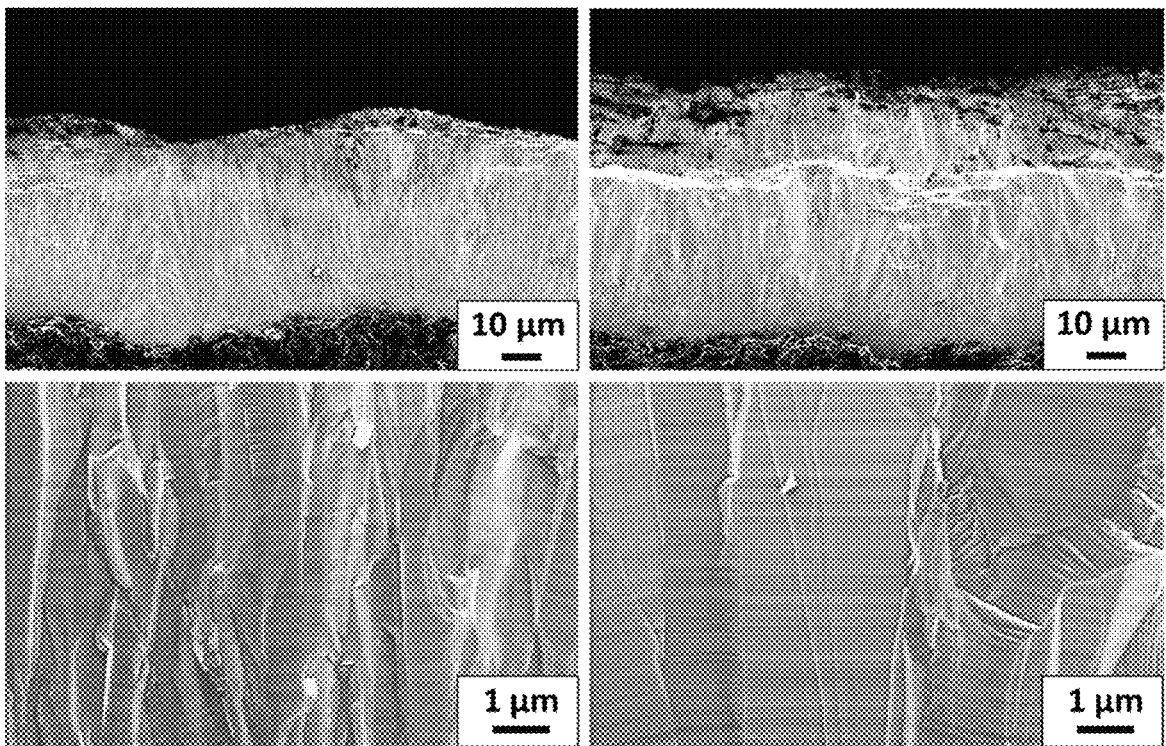
FIG. 2 and the right panels of FIG. 8 show cross-section SEM images.

Cross-section SEM images reveal a columnar structure of the grains growing from the graphite surface (FIG. 2). The lines running parallel to the surface are caused by twinning planes within the SiC crystals. It is assumed that those twinning planes are often parallel to the (111) crystal plane.

Figure 3:
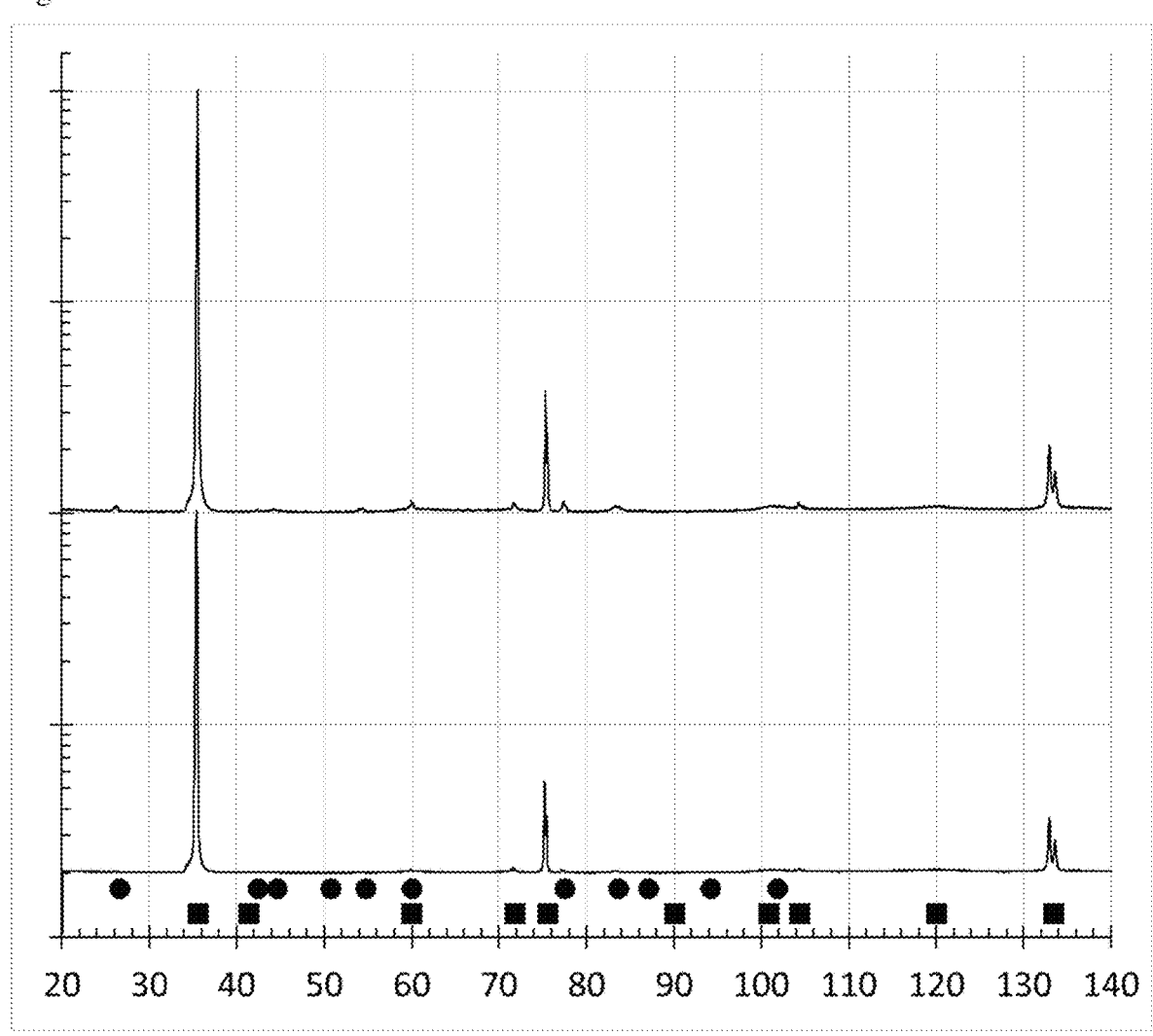
FIG. 3 shows X-ray diffractograms of layers shown in FIG. 1 (intensity in logarithmic scale for enhanced visibility of low-intensity peaks).

FIG. 3 shows an X-ray diffractogram of samples 1 (top) and 2 (bottom). The intensity is plotted in a logarithmic scale for enhanced visibility of low intensity peaks. Peaks denoted with a square are caused by β-SiC, peaks denoted by a circle are caused by graphite. The X-ray diffractograms of samples 1 and 2 (3) show only three strong peaks. These peaks are located at 2θ values as indicated on the horizontal axis of 35.6°, 75.2°, and at ~133° and are assigned to the (111), (222), and (333)/(511)-planes of the β-SiC crystal.

It should be noticed that the (333) and (511) planes of β-SiC both create a signal at 2θ ranging from 132.4° to 134.4° that we cannot distinguish. Therefore this signal is herein labelled (333)/(511). The fact that only (111) and (222) signals are seen in high intensity lead to the conclusion, that the third peak is caused mainly by the (333) plane. All three planes are parallel and belong to the same family of planes.

The (111) signal is by far the strongest signal, with the (222) and (333)/(511) signals being below 4% of the (111) intensity (Table 2). The most intense β-SiC XRD signal that is not caused by planes parallel to the (111) plane is the (220) signal (0.13%) for sample 1, and the (311) & (420) signals (0.11%) for sample 2. The extremely low signal intensity of planes not parallel to (111) shows the strong preference of the orientation of crystals in layer of the present disclosure. The intensity of the (111)-orientation can be quantified by the orientational quality Q of (111)+(222)+(333)/(511) plane family signals to the total XRD signal intensity of all signals, according to the following equation:

$$Q = \frac{I_{111} + I_{222} + I_{333/511}}{I_{111} + I_{200} + I_{220} + I_{311} + I_{222} + I_{400} + I_{331} + I_{420} + I_{333/511} + I_{422}}$$

The orientational quality Q is 1, if only (111), (222), and (333)/(511) signals are detected, i.e. if all measured crystals are completely oriented in a way that the (111) plane is parallel to the substrate surface. The orientational quality Q is 0, if none of the (111)-family signals are detected, i.e. if none of the measured crystals is oriented with (111) plane parallel to the substrate surface. In a randomly oriented powder, the expected orientational quality Q is 0.5116, due to the expected varying intensities of signals.

TABLE 2

XRD signal relative intensities for a theoretical random powder, and for samples 1 and 2.

| | | Relative intensity/% | | |
|---|---|---|---|---|
| Plane | 2θ/° | Random powder | Sample 1 | Sample 2 |
| (111) | 35.6 | 100 | 100 | 100 |
| (200) | 41.4 | 20 | 0.02 | 0.02 |
| (220) | 60.0 | 35 | 0.13 | 0.06 |

TABLE 2-continued

XRD signal relative intensities for a theoretical
random powder, and for samples 1 and 2.

| | | Relative intensity/% | | |
|---|---|---|---|---|
| Plane | 2θ/° | Random powder | Sample 1 | Sample 2 |
| (311) | 71.8 | 25 | 0.12 | 0.11 |
| (222) | 75.5 | 5 | 2.72 | 3.39 |
| (400) | 90.0 | 5 | 0.02 | 0.01 |
| (331) | 100.8 | 10 | 0.08 | 0.07 |
| (420) | 104.4 | 5 | 0.11 | 0.11 |
| (422) | 120.0 | 5 | 0.08 | 0.08 |
| (333)/(511) | 133.4 | 5 | 1.08 | 1.68 |
| Q | | 0.5116 | 0.9947 | 0.9956 |

The random powder values are taken from the powder diffraction file (PDF card) #00-029-1129.

All intensities mentioned herein are maximum intensities, i.e. intensities derived from the highest points of the corresponding peaks in the X ray diffractogram.

Figure 4A:
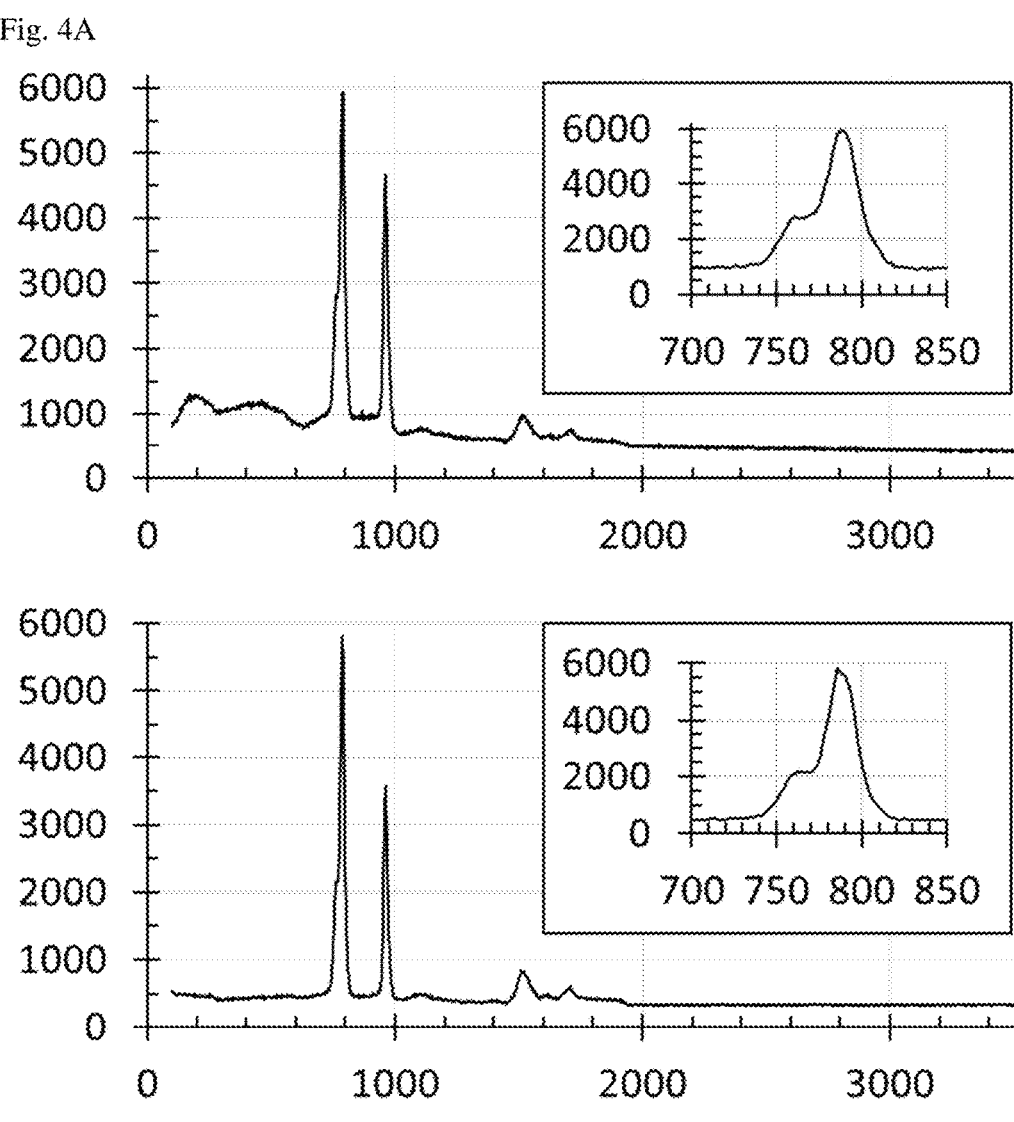
FIGS. 4A, 4B shows Raman spectra of the layers shown in FIG. 1.
Figure 4B:
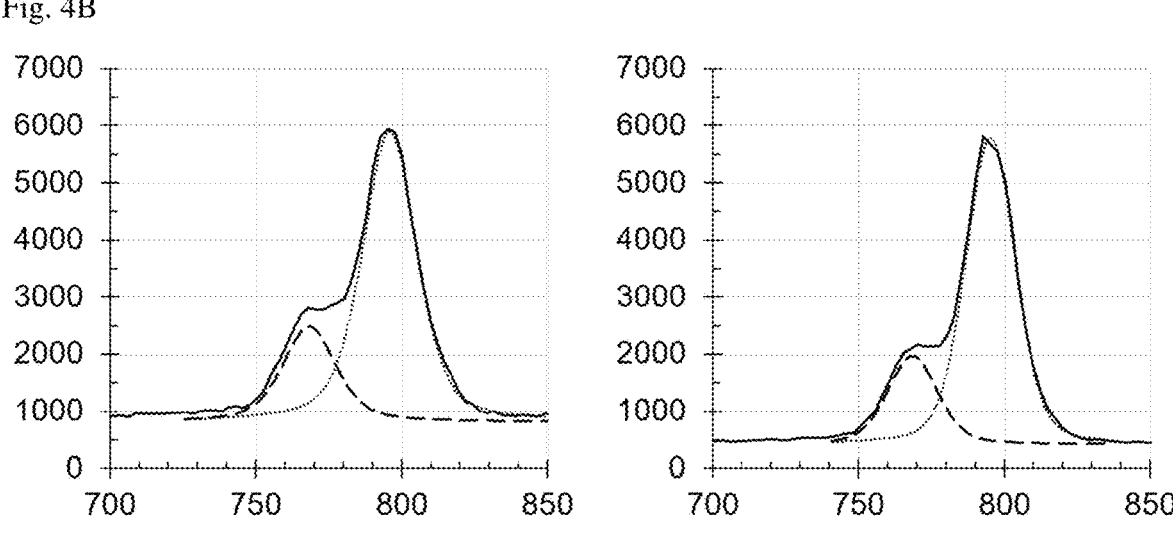

Samples 1 and 2 were further characterized with Raman spectroscopy (FIGS. 4A and 4B). The numbers on the horizontal axis are wavenumbers (unit: $cm^{-1}$), the numbers on the vertical axis are relative intensities. The major features of the spectra are the very intense TO and LO signals of β-SiC (786 $cm^{-1}$ and 963 $cm^{-1}$) and their second order peaks (1514 $cm^{-1}$ and 1703 $cm^{-1}$). It can be seen from FIG. 4B that the signals with maxima at about 786 $cm^{-1}$ originated from two overlapping peaks. There is another minor peak around 1612 $cm^{-1}$, which could be caused by graphitic carbon. For sample 1, there are also the LA and TA signal visible at 196 $cm^{-1}$ and 462 $cm^{-1}$, which indicate a small grain size.

FIG. 4B illustrates that Raman spectra of the layers of samples 1 (left) and 2 (right) comprised two overlapping peaks in a range from 730 to 840 $cm^{-1}$. For both samples, the overlapping peaks were fitted with two Pseudo-Voigt-Curves (linear combination of Gaussian & Lorentzian functions). The fit was carried out without special background treatment. This revealed that a first of these peaks had its maximum intensity at ~768 $cm^{-1}$ and a second of these peaks had its maximum intensity between 795 and 796 $cm^{-1}$. Table 3 provides further details. A surface area ratio calculated by dividing a first surface area of the first peak by a second surface area of the second peak, was 0.33 for sample 1, and 0.30 for sample 2.

TABLE 3

| | Sample 1 (1100 ° C.) | | Sample 2 (1200 ° C.) | |
|---|---|---|---|---|
| | Peak 1 | Peak 2 | Peak 1 | Peak 2 |
| xc-center | 795.7 | 768.3 | 795.2 | 768.4 |
| A-area | 142936.3 | 47342.3 | 128989.1 | 38590.4 |
| w-FWHM | 21.7 | 21.6 | 20.1 | 20.3 |
| Y max-max int. | 5896.9 | 2482.7 | 5783.0 | 19693 |

Example 2—Growth on Graphite with Varying C/Si Ratio

Several deposition experiments have been conducted to investigate the influence of carbon precursor concentration and the resulting C/Si molar gas phase ratio on the coating.

The C/Si was varied by altering the flow of toluene, while the other parameters were kept constant (Table 4, sample 2 is from above example 1).

TABLE 4

CVD growth conditions for samples 2 and 4 and
comparative samples 3 and 5

| | T/° C. | p/mbar | H₂/Si molar ratio | C/Si molar ratio (gas phase) |
|---|---|---|---|---|
| Sample 2 | 1200 | 100 | 23 | 1.0 |
| Comparative Sample 3 | 1200 | 100 | 23 | 0.8 |
| Sample 4 | 1200 | 100 | 23 | 1.2 |
| Comparative Sample 5 | 1200 | 100 | 23 | 1.5 |

Figure 5A:
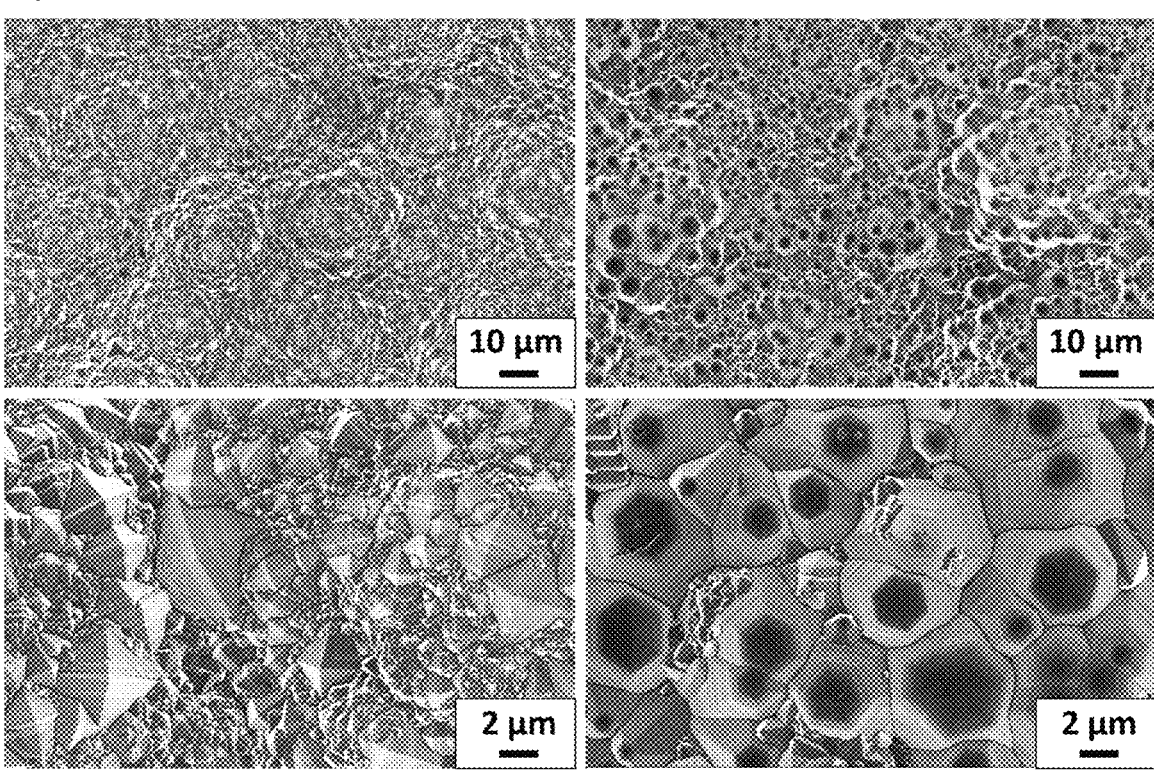
Figure 5B:
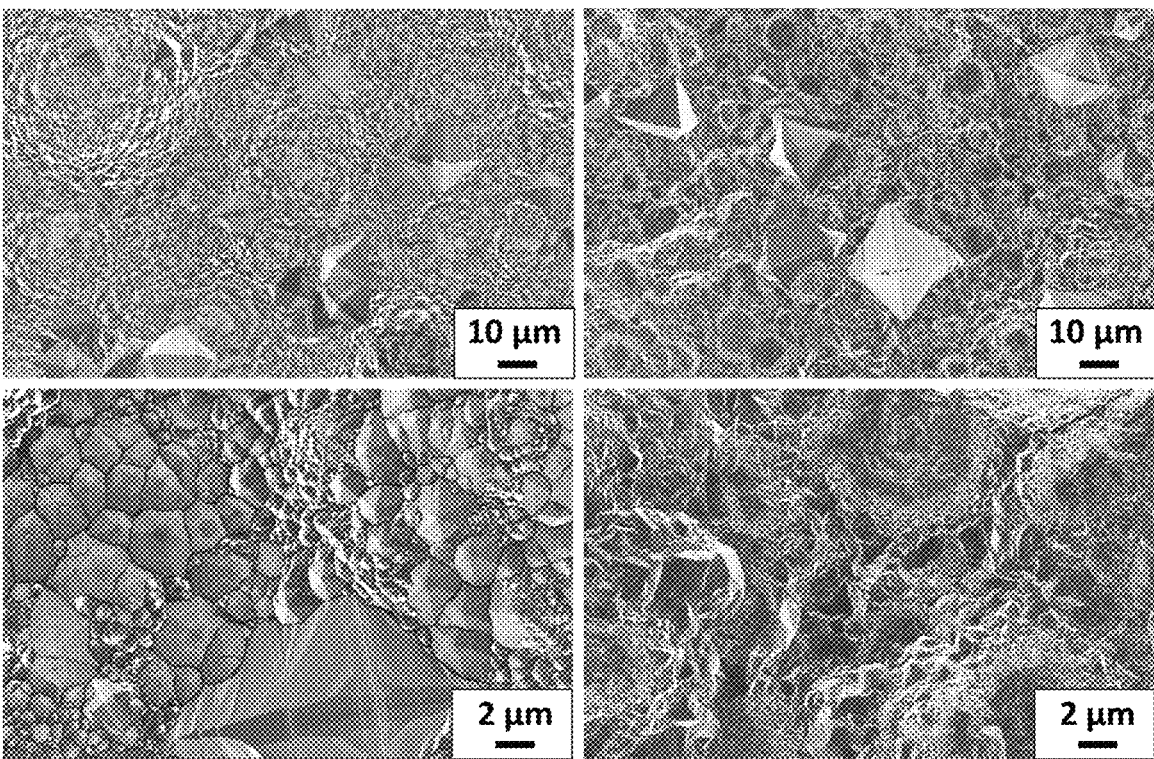
Figure 6:
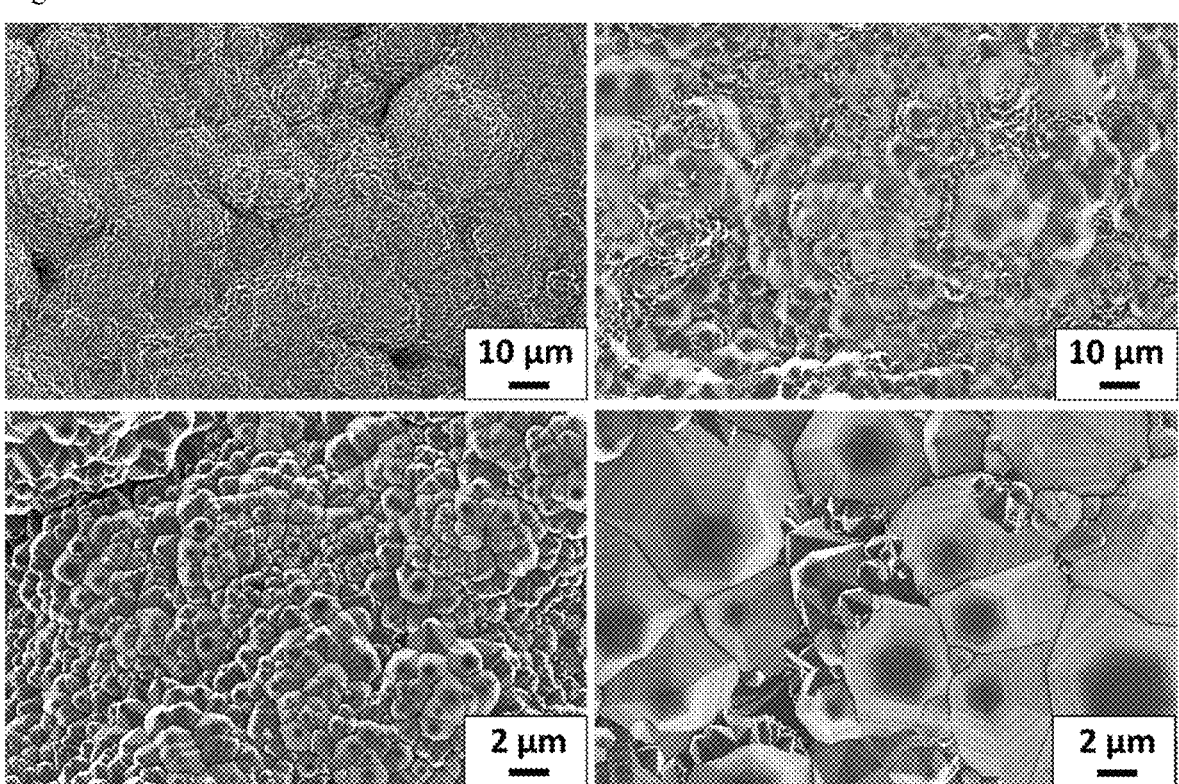
Figure 7:
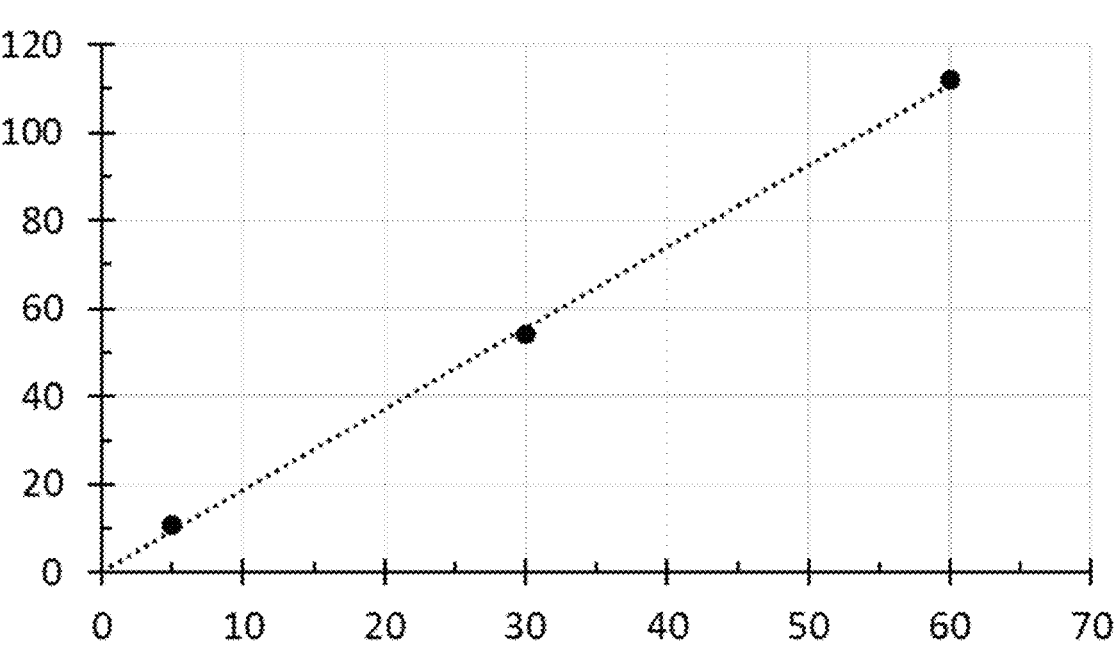
FIG. 7 shows layer thickness growth as a function of the duration of a CVD coating method of the present disclosure.

FIGS. 1A and 5B show SEM top-view images of graphite substrates coated with the layers formed at the different conditions of Table 4. Sample 2 is shown in FIG. 5A on the right. Sample 4 is shown in FIG. 5B on the left. The panels shown in FIG. 5A on the left (comparative sample 3) and in FIG. 5B on the right (comparative sample 5) show SEM top-view images of other layers made at extreme conditions of molar carbon excess and molar silicon excess, respectively. Only samples 2 and 4 show the characteristic silicon carbide crystal tops of the present disclosure. Coating at molar excess of either carbon or silicon, on the other hand, resulted in different surface morphology, in essence without refractory carbide crystal tops having a regular hexagonal pyramid shape.

The intensities of the XRD peaks are summarized in Table 5. The XRD peak intensities for comparative sample 3 are much closer to that of a randomly oriented powder than samples 2 and 4, indicating absence of a strongly preferred crystal orientation in the layer of sample 3. Samples 2 and 4 have the (111) peak as strongest peak, followed by the (222) and (333)/(511) peaks, highlighting a strong (111) preferred orientation of the coatings. The most intense peak from another family of planes are the (311) and (420) peaks for sample 2 with 0.11%, and the (311) peak for sample 4 with 0.80%. For comparative sample 5, the (220) peak is the most intense, followed by the (111) peak with 17.58%, which indicates a strong (220) orientation of the coating. It seems that the formation of a layer of the present disclosure is disfavored by extreme C/Si molar ratios, whereas layers of the present disclosure are readily formed in a range between these extreme C/Si molar ratios. This range includes C/Si molar ratios of 1.0 to 1.2.

TABLE 5

XRD signal relative intensities for a theoretical random powder,
and for samples 2 and 4 and comparative samples 3 and 5.

| | | | Relative intensity/% | | | |
|---|---|---|---|---|---|---|
| Plane | 2θ/° | Random powder | Comp. Sample 3 | Sample 2 | Sample 4 | Comp. Sample 5 |
| (111) | 35.6 | 100 | 100 | 100 | 100 | 17.58 |
| (200) | 41.4 | 20 | 4.74 | 0.02 | 0.07 | 10.58 |
| (220) | 60.0 | 35 | 30.88 | 0.06 | 0.32 | 100 |
| (311) | 71.8 | 25 | 26.91 | 0.11 | 0.80 | 15.49 |
| (222) | 75.5 | 5 | 3.20 | 3.39 | 3.09 | 0.61 |
| (400) | 90.0 | 5 | 1.24 | 0.01 | 0.03 | 2.57 |
| (331) | 100.8 | 10 | 6.62 | 0.07 | 0.20 | 4.76 |
| (420) | 104.4 | 5 | 2.40 | 0.11 | 0.16 | 2.04 |

TABLE 5-continued

| | | | | Relative intensity/% | | |
|---|---|---|---|---|---|---|
| Plane | 2θ/° | Random powder | Comp. Sample 3 | Sample 2 | Sample 4 | Comp. Sample 5 |
| (422) | 120.0 | 5 | 14.69 | 0.08 | 0.63 | 4.16 |
| (333)/ (511) | 133.4 | 5 | 6.69 | 1.68 | 1.45 | 3.22 |
| Q | | 0.5116 | 0.5568 | 0.9956 | 0.9793 | 0.1330 |

*XRD signal relative intensities for a theoretical random powder, and for samples 2 and 4 and comparative samples 3 and 5.*

Example 3—Growth on Graphite with Varying Deposition Time

The thickness of layers of the present disclosure can be adjusted by altering the deposition time. In addition to sample 2 of example 1 (deposition time 30 min), sample 6 involved shortened deposition for only 5 minutes, while sample 7 involved prolonged deposition for 60 minutes (Table 6). The remainder of the process conditions remained unchanged.

TABLE 6

CVD growth conditions for samples 2, 6, and 7

| | T/° C. | p/mbar | H₂/Si molar ratio | Deposition time/min |
|---|---|---|---|---|
| Sample 6 | 1200 | 100 | 23 | 5 |
| Sample 2 | 1200 | 100 | 23 | 30 |
| Sample 7 | 1200 | 100 | 23 | 60 |

FIG. 2 illustrates the average layer thickness (vertical axis, unit: μm) of samples 2, 6, and 7, as a function of deposition time (horizontal axis, unit: minutes). FIG. 3 shows top-view SEM images of samples 6 on the left and 7 on the right. The surfaces of samples 6 and 7 comprise crystal tops having a regular hexagonal pyramid shape (8). The grain size and the coating thickness (FIG. 2) both increase from sample 6 to 2 to 7 with increasing deposition time. This demonstrates that the preferred orientation does not change as the coating grows thicker, and that it is not a surface effect of the substrate. Indeed, the XRD data in Table 7 proves that crystals are even more oriented in the (111) direction, as the thickness increases, showing that the preferentially oriented coating is a result of the coating process itself.

TABLE 7

| | | | Relative intensity/% | | |
|---|---|---|---|---|---|
| Plane | 2θ/° | Random powder | 6 | 2 | 7 |
| (111) | 35.6 | 100 | 100 | 100 | 100 |
| (200) | 41.4 | 20 | 0.64 | 0.02 | 0.02 |
| (220) | 60.0 | 35 | 3.22 | 0.06 | 0.06 |
| (311) | 71.8 | 25 | 2.68 | 0.11 | 0.10 |
| (222) | 75.5 | 5 | 2.41 | 3.39 | 3.87 |
| (400) | 90.0 | 5 | 0.40 | 0.01 | 0.01 |
| (331) | 100.8 | 10 | 1.51 | 0.07 | 0.03 |

*XRD signal relative intensities for a theoretical random powder, and for samples 2, 6, and 7.*

TABLE 7-continued

| | | | Relative intensity/% | | |
|---|---|---|---|---|---|
| Plane | 2θ/° | Random powder | 6 | 2 | 7 |
| (420) | 104.4 | 5 | 1.30 | 0.11 | 0.07 |
| (422) | 120.0 | 5 | 0.75 | 0.08 | 0.04 |
| (333)/ (511) | 133.4 | 5 | 1.64 | 1.68 | 1.95 |
| Q | | 0.5116 | 0.9084 | 0.9956 | 0.9968 |

*XRD signal relative intensities for a theoretical random powder, and for samples 2, 6, and 7.*

Example 4—Growth on Silicon Wafer

Figure 8:
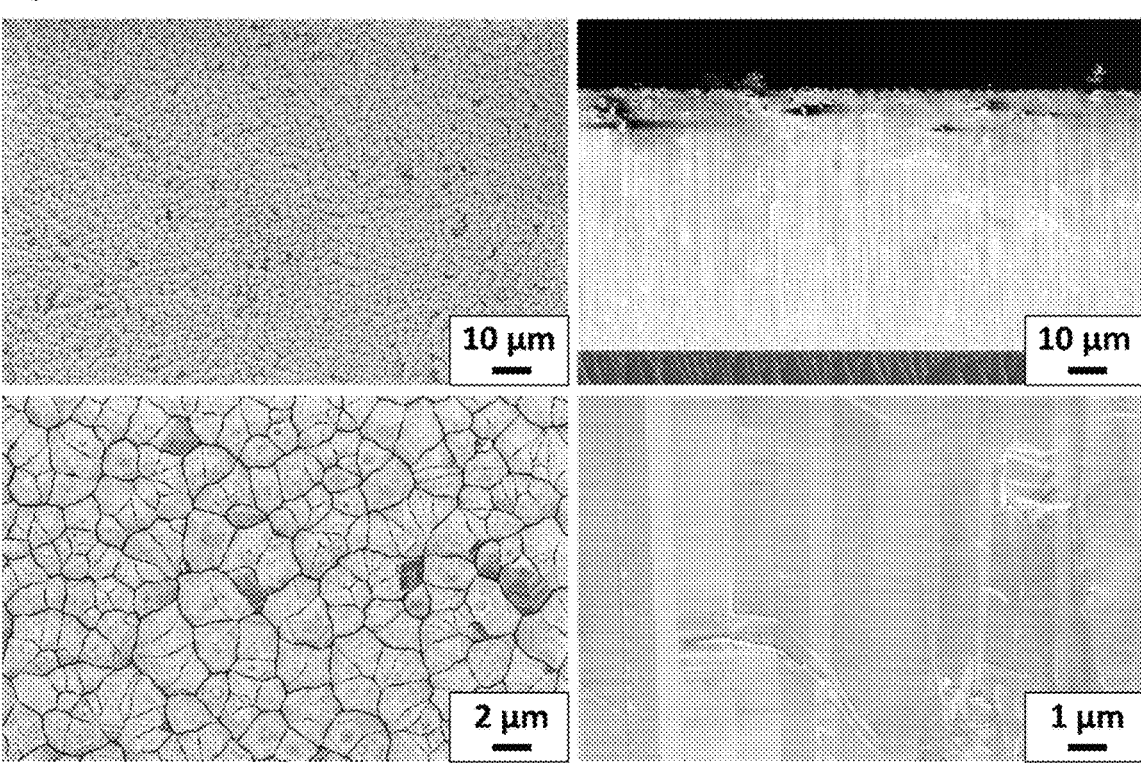

The CVD process demonstrated here is not only capable of creating highly (111)-oriented β-SiC coatings on polycrystalline, isotropic substrates like isostatic graphite, but also on single crystalline substrates like silicon wafers. (hkl)-orientation in this document means that the (hkl) plane (and therefore any parallel crystalline planes) are predominantly oriented parallel to a surface of the layer. Single crystalline substrates can influence the growth so that the growing layer follows the crystalline orientation of oriented just as the substrate, if the two crystal structures of substrate and layer are sufficiently similar (epitaxial growth). A piece of (100)-oriented silicon wafer has been coated with β-SiC (sample 8) under conditions similar to sample 2 in example 1. Again, the coating at the surface consists of crystals showing a hexagonal pattern (FIG. 8). The cross section reveals the columnar, well ordered growth of the highly oriented crystals. Also, XRD shows that the coating is highly (111)-oriented, with Q of 0.9993.

TABLE 8

| | | | Relative intensity/% | |
|---|---|---|---|---|
| Plane | 2θ/° | Random powder | 8 | |
| (111) | 35.6 | 100 | 100 | |
| (200) | 41.4 | 20 | 0.010 | |
| (220) | 60.0 | 35 | 0.011 | |
| (311) | 71.8 | 25 | 0.017 | |
| (222) | 75.5 | 5 | 4.114 | |
| (400) | 90.0 | 5 | 0.004 | |
| (331) | 100.8 | 10 | 0.005 | |
| (420) | 104.4 | 5 | 0.006 | |
| (422) | 120.0 | 5 | 0.024 | |
| (333)/(511) | 133.4 | 5 | 2.625 | |
| Q | | 0.5116 | 0.9993 | |

*XRD peak intensities of sample 8, relative to the strongest peak.*

Example 5—Nanoindentation Measurements

Hardness was measured via nanoindentation on a polished surface; however, the coating should be at least 100 μm thick in order to avoid influences of the substrate on the hardness measurement. Nanoindentation measurements have been performed on various refractory carbide layers of the present disclosure with varying crystalline orientation (quantified by ratio Q). For all samples, the measurements were performed on polished cross sections, additionally, measurements were also performed on polished top surfaces for coatings with more than 100 μm thickness.

Figure 9:
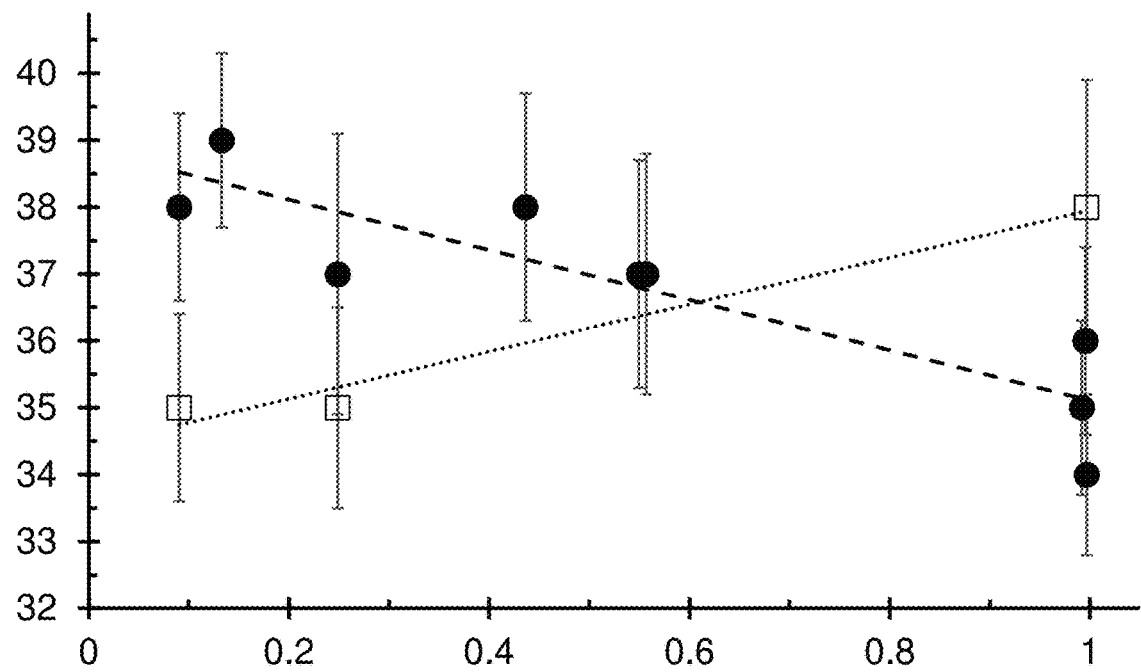
FIG. 9 illustrates hardness measured by nanoindentation.

In FIG. 9, the results of nanoindentation measurements (vertical axis, unit: GPa) are plotted against the orientational quality Q of the sample under investigation (horizontal axis). Open squares denote results of nanoindentation measurements on polished top surfaces. Filled circles denote results of nanoindentation measurements on polished cross sections.

It has surprisingly been found that in refractory carbide layers, the SiC crystals possess at least one of the "surface property", the "cross section property" and the "Raman spectral property" as described herein and have very high hardness when measured on the top surface. It was even more surprising that hardness measured on the top surface increased even further from ~35 GPa to ~38 GPa with increasing Q. Hardness measured on the cross-section followed an opposite trend. It decreased with increasing Q. It is assumed that these opposite trends are a consequence of the strongly preferred crystal orientation. When measuring the hardness on the cross-section, the force is actually applied at an 90° angle to the preferably oriented planes. When the more resistant (111) planes are oriented parallel to the substrate, it is assumed that the hardness measured on the cross section is reduced. This assumption is further supported by atom density. While the (111) plane of β-SiC has the highest atom density which seems to support the extraordinarily high hardness found orthogonal to these planes, "planes" orthogonal to this (111) plane have significantly lower atom density. The drop in atom density in this case seems to go in hand with a drop in hardness. Furthermore, the high atom density parallel to the surface is believed to be most resistant against etching agents.

FIG. 10 shows a SEM image of a cross section of the layer of sample 2. The horizontal line at the top of FIG. 10 is parallel to the surface of the layer. The dotted line is aligned with the parallel lines of the most strongly tilted grains of this cross section. The angle between the horizontal line and the dotted line is 12°. In this cross section, about 0% of the surface of the cross section area has a pattern of parallel lines tilted by more than 15° with respect to a surface of the layer. In order to determine an accurate percentage of a surface of a cross section area, which is tilted by more than a defined angle with respect to a surface of the layer, a skilled person would analyze a representative number of SEM images.

Example 6—Growth of a Multilayer Structure Comprising Highly (111)-Oriented SiC A layer of the present disclosure can also be a part of a multilayer structure. In this example, a 6-layer coating system comprising 3 highly (111)-oriented and 3 non-(111)-oriented layers have been deposited onto an isostatic graphite substrate. The layers have been created by switching the hydrocarbon gas and altering the C/Si ratio during the process.

TABLE 9

| | | | CVD growth conditions | | |
|---|---|---|---|---|---|
| | T/° C. | p/mbar | H₂/Si molar ratio | C/Si molar ratio (gas phase) | Hydrocarbon |
| Highly (111)-oriented layer | 1200 | 100 | 23 | 1.0 | toluene |
| Non-(111)-oriented layers | 1200 | 100 | 23 | 0.6 | ethylene |

Figure 11:
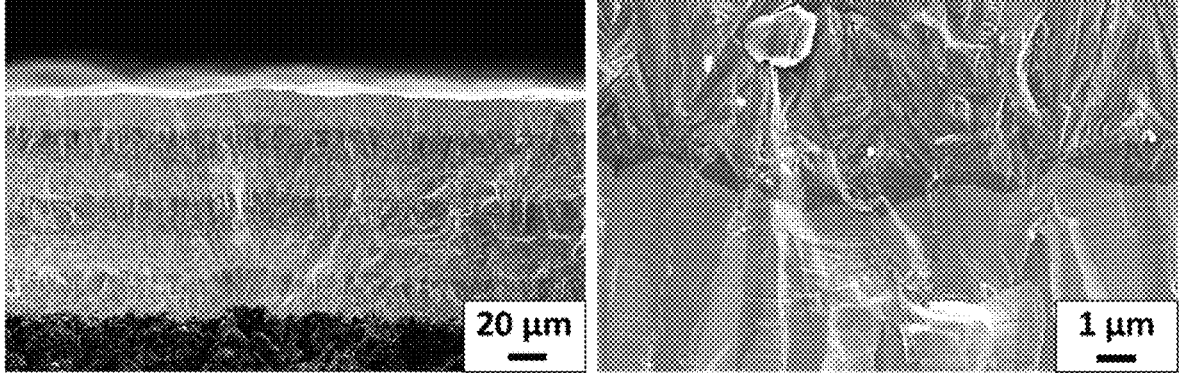
FIG. 11 illustrates a multilayered example according to the present disclosure.

As can be seen in FIG. 11, the orientation of the layers, visible by the pattern of lines parallel to the surface, can be changed during the deposition process. The lines are readily visible in the exemplary enlarged area shown on the right of FIG. 11. In the coating of the Example 6, layers 2, 4, and 6 (counting from the substrate) are layers of the present disclosure, layers 1, 3, and 5 are layers not oriented in the (111) direction. Such a multilayered structure may be able to reduce the risk of etch pinhole formation in cleaning processes and might also reduce damage induced by chipping the coating from the substrate under high mechanical load.

The present application further pertains to the following list of embodiments:

1. A layer comprising refractory carbide crystals,
   wherein a surface of the layer comprises refractory carbide crystal tops having a regular hexagonal pyramid shape, and less than 10% of the surface is occupied by large crystal tops having a regular hexagonal pyramid shape wherein a distance from one corner of a regular hexagonal base of the top to an opposite corner of the base is at least 25 μm;
   and/or
   wherein in SEM image analysis of a cross section of the layer, at most 20% of the surface of the cross section area has a pattern of parallel lines tilted by more than 15° with respect to a portion of a surface of the layer which is closest to the respective image;
   and/or
   wherein the refractory carbide crystals are silicon carbide crystals and a Raman spectrum of the layer comprises two overlapping peaks, a first of these peaks having its maximum intensity in a range from 758 to 778 cm⁻¹, a second of these peaks having its maximum intensity in a range from 785 to 805 cm⁻¹, and a surface area ratio calculated by dividing a first surface area of the first peak by a second surface area of the second peak is at least 0.05.

2. The layer according to embodiment 1, wherein a fraction of at least 10% of the surface is covered by the tops having the regular hexagonal pyramid shape.

3. The layer according to embodiment 1, wherein the surface has a mean linear intercept surface grain size in a range from 0.2 to 25 μm.

4. The layer according to embodiment 1, wherein the refractory carbide crystals are silicon carbide crystals.

5. The layer according to embodiment 1, wherein a maximum peak intensity $I_{220}$ is at most 10% of a maximum peak intensity $I_{111}$ in an x-ray diffractogram of the layer detected with Cu k-alpha radiation at 1.5406 Å wavelength.

6. The layer according to embodiments 1 or 4 in which a distribution of the silicon carbide crystal orientations is such that an orientational quality Q which is calculated from maximum peak intensities of an x-ray diffractogram detected with Cu k-alpha radiation at 1.5406 Å wavelength, according to the following formula $$Q = \frac{I_{111} + I_{222} + I_{333/511}}{I_{111} + I_{200} + I_{220} + I_{311} + I_{222} + I_{400} + I_{331} + I_{420} + I_{333/511} + I_{422}}$$

wherein
   $I_{111}$ is the maximum intensity at 2θ ranging from 34.6° to 36.6°,
   $I_{200}$ is the maximum intensity at 2θ ranging from 40.4° to 42.4°, $I_{220}$ is the maximum intensity at 2θ ranging from 59.0° to 61.0°, $I_{311}$ is the maximum intensity at 2θ ranging from 70.8° to 72.8°, $I_{222}$ is the maximum intensity at 2θ ranging from 74.5° to 76.5°, $I_{400}$ is the maximum intensity at 2θ ranging from 89.0° to 91.0°, $I_{331}$ is the maximum intensity at 2θ ranging from 99.8° to 101.8°, $I_{420}$ is the maximum intensity at 2θ ranging from 103.4° to 105.4°, $I_{333/511}$ is the maximum intensity at 2θ ranging from 132.4° to 134.4°, $I_{422}$ is the maximum intensity at 2θ ranging from 119.0° to 121.0°, is at least 0.60.

7. The layer according to embodiment 6, wherein each of the intensities $I_{200}$, $I_{220}$, $I_{311}$, $I_{400}$, $I_{331}$, $I_{420}$, $I_{422}$ is at most 80% of its corresponding reference intensity $I_{200}R$, $I_{220}R$, $I_{311}R$, $I_{400}R$, $I_{331}R$, $I_{420}R$, $I_{422}R$ that would be expected in case of random distribution of silicon carbide crystal orientations.

8. The layer according to embodiment 1, wherein the surface hardness of the layer is at least 0.5% higher than the section hardness of the layer.

9. A device for high temperature applications, wherein the device comprises a layer of at least one of the preceding embodiments on a surface of a material of the device.

10. The device according to embodiment 9, wherein the material of the device comprises graphite, elemental silicon, or silicon carbide.

11. A refractory carbide coated wafer carrier comprising or made of a layer of at least one of the preceding embodiments.

12. A CVD method for preparing a layer according to embodiment 1, a device according to embodiment 9, or a wafer carrier according to embodiment 11, wherein at least part of the layer is formed from a gas containing a silicon source and an aromatic carbon source.

13. A layer comprising refractory carbide crystals, preferably the layer according to embodiment 1, wherein the layer is a free-standing layer and wherein the roughness of one surface of the layer is in a range from 0.01 nm to 100 nm or from 100 nm to 10 μm.

14. Use of a layer according to at least one of embodiments 1 to 8 or 13, of a device according to at least one of embodiments 9 or 10, of a refractory carbide coated wafer carrier according to embodiment 11 or of a layer, device or wafer carrier made according to the method of embodiment 12, for supporting a semiconductor material.

The invention claimed is:

1. A layer comprising silicon carbide crystals, wherein in SEM image analysis of a cross section of the layer, at most about 20% of the surface of the cross section area has a pattern of parallel lines tilted by more than 15° with respect to a portion of a surface of the layer which is closest to the respective image;

wherein a surface of the layer has a mean linear intercept surface grain size in a range of 0.2-25 μm;

wherein the surface of the layer comprises refractory carbide crystal tops having a regular hexagonal pyramid shape;

wherein a distribution of silicon carbide crystal orientations is such that an orientational quality Q is at least about 0.95, wherein the orientational quality Q is calculated from maximum peak intensities of an X-ray diffractogram detected with Cu k-alpha radiation at 1.5406 Å wavelength, according to the following formula $$Q = \frac{I_{111} + I_{222} + I_{333/511}}{I_{111} + I_{200} + I_{220} + I_{311} + I_{222} + I_{400} + I_{331} + I_{420} + I_{333/511} + I_{422}}$$

wherein $I_{111}$ is the maximum intensity at 2θ ranging from 34.6° to 36.6°, $I_{200}$ is the maximum intensity at 2θ ranging from 40.4° to 42.4°, $I_{220}$ is the maximum intensity at 2θ ranging from 59.0° to 61.0°, $I_{311}$ is the maximum intensity at 2θ ranging from 70.8° to 72.8°, $I_{222}$ is the maximum intensity at 2θ ranging from 74.5° to 76.5°, $I_{400}$ is the maximum intensity at 2θ ranging from 89.0° to 91.0°, $I_{331}$ is the maximum intensity at 2θ ranging from 99.8° to 101.8°, $I_{420}$ is the maximum intensity at 2θ ranging from 103.4° to 105.4°, $I_{333/511}$ is the maximum intensity at 2θ ranging from 132.4° to 134.4°, $I_{422}$ is the maximum intensity at 2θ ranging from 119.0° to 121.0°.

2. The layer according to claim 1, wherein less than 10% of the surface is occupied by crystal tops having a regular hexagonal pyramid shape wherein a distance from one corner of a regular hexagonal base of the top to an opposite corner of the base is at least about 25 μm;

and/or wherein the layer is characterized by a Raman spectrum of the layer comprising two overlapping peaks, a first of these peaks having its maximum intensity in a range from 758 to 778 cm$^{-1}$, a second of these peaks having its maximum intensity in a range from 785 to 805 cm$^{-1}$, and a surface area ratio calculated by dividing a first surface area of the first peak by a second surface area of the second peak is at least about 0.05.

3. The layer according to claim 2, wherein a fraction of at least 10% of the surface is covered by the tops having the regular hexagonal pyramid shape.

4. The layer according to claim 1, wherein the orientational quality Q is at least about 0.97.

5. The layer according to claim 1, wherein the mean linear intercept surface grain size of the surface is in a range from about 0.4 to about 10 μm.

6. The layer according to claim 1, wherein the surface hardness of the layer is at least about 0.5% higher than the cross-sectional hardness of the layer.

7. The layer according to claim 1, wherein the average roughness Ra according to ISO 4287 of one surface of the layer is in a range from about 0.1 nm to about 100 nm (nanoscale roughness); or in a range from about 100 nm to about 10 μm (microscale roughness).

8. The layer according to claim 1, wherein the thickness of the layer is at least about 0.5 μm.

9. A device for high temperature applications, wherein the device comprises a layer according to claim 1 on a surface of the device.

10. A support for a semiconductor material, comprising a layer according to claim 1.

11. A wafer carrier comprising a layer according to claim 1 disposed on a surface thereof.

\* \* \* \* \*